US010359961B2

(12) United States Patent
Ito et al.

(10) Patent No.: US 10,359,961 B2
(45) Date of Patent: Jul. 23, 2019

(54) STORAGE DEVICE

(71) Applicant: Toshiba Memory Corporation, Minato-ku (JP)

(72) Inventors: Mikihiko Ito, Ota (JP); Masaru Koyanagi, Ota (JP); Shintaro Hayashi, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 207 days.

(21) Appl. No.: 15/507,822

(22) PCT Filed: Sep. 12, 2014

(86) PCT No.: PCT/JP2014/074330
§ 371 (c)(1),
(2) Date: Mar. 1, 2017

(87) PCT Pub. No.: WO2016/038748
PCT Pub. Date: Mar. 17, 2016

(65) Prior Publication Data
US 2017/0286000 A1 Oct. 5, 2017

(51) Int. Cl.
G06F 13/16 (2006.01)
G06F 3/06 (2006.01)
(Continued)

(52) U.S. Cl.
CPC .......... G06F 3/0635 (2013.01); G06F 1/3287 (2013.01); G06F 3/0625 (2013.01);
(Continued)

(58) Field of Classification Search
CPC .................................. G06F 13/16; G06F 3/06
(Continued)

(56) References Cited

U.S. PATENT DOCUMENTS 5,159,598 A * 10/1992 Welles, II ........ G01R 31/31853
714/724
5,625,593 A * 4/1997 Kimura .................. G11O 5/143
235/441

(Continued)

FOREIGN PATENT DOCUMENTS

CN 102890859 A 1/2013
JP 11-174121 A 7/1999
(Continued)

OTHER PUBLICATIONS

International Search Report dated Dec. 2, 2014 in PCT/JP2014/074330.

Primary Examiner — Christopher B Shin
(74) Attorney, Agent, or Firm — Oblon, McClelland, Maier & Neustadt, L.L.P.

(57) ABSTRACT

According to one embodiment, there is provided a storage device including a control chip and a plurality of memory chips. The control chip has an input buffer common to the control chip and the plurality of memory chips and electrically connected to an external terminal. A first transmission path going through the input buffer and a second transmission path not going through the input buffer are provided between the external terminal and the plurality of memory chips. In a first mode, the control chip enables the input buffer so as to activate the first transmission path and, in a second mode, disables the input buffer so as to activate the second transmission path.

6 Claims, 10 Drawing Sheets

(51) Int. Cl.
*G11C 29/12* (2006.01)
*G06F 1/3287* (2019.01)
*G06F 13/40* (2006.01)
*G06F 13/42* (2006.01)
*G11C 5/02* (2006.01)
*G11C 29/02* (2006.01)
*G11C 29/48* (2006.01)

(52) U.S. Cl.
CPC .......... *G06F 3/0656* (2013.01); *G06F 3/0683* (2013.01); *G06F 13/1673* (2013.01); *G06F 13/4022* (2013.01); *G06F 13/4282* (2013.01); *G11C 5/025* (2013.01); *G11C 29/021* (2013.01); *G11C 29/12* (2013.01); *G11C 29/1201* (2013.01); *G11C 29/48* (2013.01)

(58) Field of Classification Search
USPC .......................................................... 710/310
See application file for complete search history.

(56) References Cited

U.S. PATENT DOCUMENTS

| | | | | |
|---|---|---|---|---|
| 5,654,664 | A * | 8/1997 | Park | H03K 19/0027 326/71 |
| 5,774,472 | A * | 6/1998 | Matsuoka | G11C 29/12 714/718 |
| 6,330,297 | B1 * | 12/2001 | Kano | G11C 29/12 324/527 |
| 6,732,304 | B1 * | 5/2004 | Ong | G11C 29/1201 365/201 |
| 7,133,798 | B1 * | 11/2006 | Ong | G01R 31/31713 702/117 |
| 9,209,160 | B2 | 12/2015 | Lee | |
| 2001/0045645 | A1 | 11/2001 | Sasaki et al. | |
| 2002/0048189 | A1 | 4/2002 | Matsubara et al. | |
| 2002/0051382 | A1 | 5/2002 | Matsubara et al. | |
| 2002/0088003 | A1 * | 7/2002 | Salee | H04N 7/165 725/111 |
| 2002/0181289 | A1 | 12/2002 | Matsubara et al. | |
| 2003/0021157 | A1 | 1/2003 | Matsubara et al. | |
| 2004/0257847 | A1 | 12/2004 | Matsui et al. | |
| 2004/0268025 | A1 | 12/2004 | Matsubara et al. | |
| 2006/0023540 | A1 | 2/2006 | Higashi et al. | |
| 2006/0034129 | A1 | 2/2006 | Matsubara et al. | |
| 2006/0262587 | A1 | 11/2006 | Matsui et al. | |
| 2007/0058471 | A1 | 3/2007 | Rajan et al. | |
| 2007/0133308 | A1 | 6/2007 | Matsubara et al. | |
| 2007/0246807 | A1 | 10/2007 | Hara et al. | |
| 2008/0028134 | A1 | 1/2008 | Matsubara et al. | |
| 2008/0111582 | A1 | 5/2008 | Matsui et al. | |
| 2009/0157953 | A1 | 6/2009 | Matsubara et al. | |
| 2009/0219745 | A1 | 9/2009 | Matsui et al. | |
| 2011/0085397 | A1 | 4/2011 | Sato et al. | |
| 2011/0085403 | A1 | 4/2011 | Nishioka | |
| 2011/0089973 | A1 | 4/2011 | Kondo | |
| 2011/0093735 | A1 | 4/2011 | Yoko et al. | |
| 2011/0141789 | A1 | 6/2011 | Matsui et al. | |
| 2011/0211411 | A1 | 9/2011 | Ide | |
| 2011/0286254 | A1 | 11/2011 | Yu et al. | |
| 2012/0195144 | A1 | 8/2012 | Ide et al. | |
| 2012/0262974 | A1 | 10/2012 | Matsui et al. | |
| 2012/0314511 | A1 * | 12/2012 | Ishikawa | G01R 31/2884 365/189.05 |
| 2013/0021866 | A1 | 1/2013 | Lee | |
| 2013/0070507 | A1 | 3/2013 | Yoon | |
| 2013/0121092 | A1 | 5/2013 | Ogasawara | |
| 2013/0135010 | A1 | 5/2013 | Kondo | |
| 2013/0162275 | A1 | 6/2013 | Kurihara et al. | |
| 2013/0227344 | A1 * | 8/2013 | Sohn | G06F 11/27 714/6.21 |
| 2013/0329478 | A1 | 12/2013 | Yu et al. | |
| 2014/0056086 | A1 | 2/2014 | Yoko et al. | |
| 2014/0291855 | A1 * | 10/2014 | Shin | H01L 23/481 257/774 |
| 2015/0228356 | A1 * | 8/2015 | Jeon | G11C 8/12 365/189.02 |
| 2017/0084580 | A1 * | 3/2017 | Baek | H01L 25/0657 |

FOREIGN PATENT DOCUMENTS

| | | |
|---|---|---|
| JP | 2001-307057 A | 11/2001 |
| JP | 2004-327474 A | 11/2004 |
| JP | 2006-40421 A | 2/2006 |
| JP | 2007-293982 A | 11/2007 |
| JP | 2011-81730 A | 4/2011 |
| JP | 2011-81731 A | 4/2011 |
| JP | 2011-81883 A | 4/2011 |
| JP | 2011-81884 A | 4/2011 |
| JP | 2012-255704 A | 12/2012 |
| JP | 201301472 A1 | 1/2013 |
| JP | 2013-65393 A | 4/2013 |
| JP | 2013-105512 A | 5/2013 |
| TW | 183287 A | 5/1992 |
| TW | 231343 B | 10/1994 |

* cited by examiner

STORAGE DEVICE

FIELD

Embodiments described herein relate generally to a storage device.

BACKGROUND

In storage devices, in order to improve the package density, multiple memory chips are stacked on a control chip. In this case, it is desired to reduce the consumption current of the storage device.

DETAILED DESCRIPTION

In general, according to one embodiment, a storage device includes a control chip and a plurality of memory chips. The control chip includes an input buffer common to the control chip and the plurality of memory chips and electrically connected to an external terminal. A first transmission path going through the input buffer and a second transmission path not going through the input buffer are provided between the external terminal and the plurality of memory chips. In a first mode, the control chip enables the input buffer to activate the first transmission path and, in a second mode, disables the input buffer to activate the second transmission path.

Exemplary embodiments of a storage device will be explained below in detail with reference to the accompanying drawings. The present invention is not limited to the following embodiments.

First Embodiment

Figure 1:
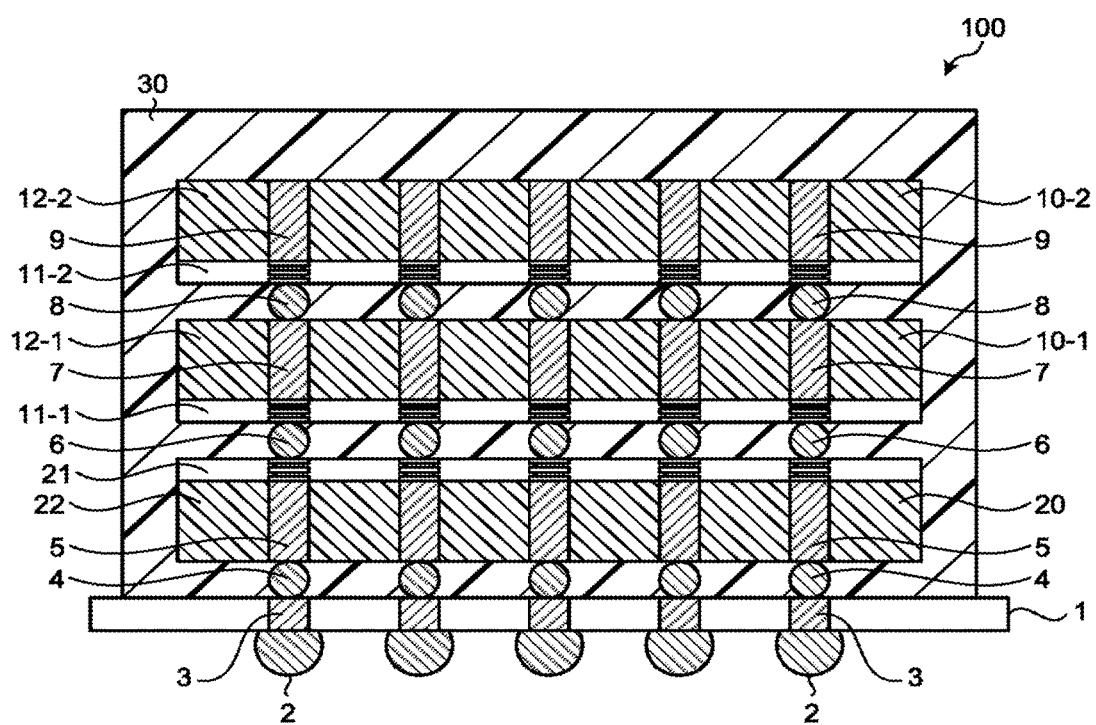
FIG. 1 is a cross-sectional view showing the configuration of a storage device according to a first embodiment.

A storage device 100 according to the first embodiment will be described using FIG. 1. FIG. 1 is a cross-sectional view showing the configuration of the storage device 100.

In the storage device 100, in order to improve the package density, multiple memory chips 10 are stacked on a control chip 20. For example, in the storage device 100, the control chip 20, a memory chip 10-1, and a memory chip 10-2 are stacked in that order on a basal plate 1 as shown in FIG. 1. They are encapsulated by encapsulation resin 30 filling spaces around them. In this case, for example, external terminals 2 are connected with elements in the chips with use of TSVs (Through Silicon Vias) extending through the substrates of the chips.

For example, the external terminals 2 are connected with elements in the control chip 20 via lands 3, bumps 4, TSVs 5, and multi-layer lines 21. The external terminals 2 are provided immediately under the basal plate 1 and electrically connected to the lands 3. The lands 3 extend through the basal plate 1 from its lower surface to its upper surface. The TSVs 5 extend through the substrate 22 of the control chip 20 from the underside to the front side and electrically connect the bumps 4 and the multi-layer lines 21.

The external terminals 2 are connected with elements in the memory chip 10-1 via the lands 3, the bumps 4, the TSVs 5, the multi-layer lines 21, bumps 6, and multi-layer lines 11-1. The bumps 6 are joined to electrode pads of the multi-layer lines 21 and electrode pads of the multi-layer lines 11-1.

The external terminals 2 are connected with elements in the memory chip 10-2 via the lands 3, the bumps 4, the TSVs 5, the multi-layer lines 21, the bumps 6, the multi-layer lines 11-1, TSVs 7, bumps 8, and multi-layer lines 11-2. The TSVs 7 extend through the substrate 12-1 of the memory chip 10-1 from the front side to the underside and electrically connect the bumps 6 and the bumps 8. The bumps 8 are joined to the TSVs 7 and electrode pads of the multi-layer lines 11-2.

It should be noted that, although FIG. 1 illustrates the case where TSVs 9 extend through the substrate 12-2 of the memory chip 10-2 from the front side to the underside, the TSVs 9 may be omitted. Further, although FIG. 1 illustrates the case where the two memory chips 10-1, 10-2 are stacked on the control chip 20, the number of memory chips 10 stacked may be three or greater.

In the storage device 100, each of the control chip 20 and the multiple memory chips 10 receives a control signal via a common external terminal 2 (input terminal) and operates according to the received control signal. For example, when receiving a chip enable signal CEn via a common CEn terminal 2a (see FIG. 2), each of the control chip 20 and the multiple memory chips 10 sets all its functions to be valid according to the chip enable signal CEn. When receiving a command latch enable signal CLE via a common CLE terminal 2b (see FIG. 2), each of the control chip 20 and the multiple memory chips 10 goes into a state of being able to accept commands according to the command latch enable signal CLE. When receiving an address latch enable signal ALE via a common ALE terminal 2c (see FIG. 2), each of the control chip 20 and the multiple memory chips 10 goes into a state of being able to accept addresses according to the address latch enable signal ALE. The control chip 20 receives a write protect signal WPn via a common WPn terminal 2e (see FIG. 2), and when the write protect signal WPn takes on an active level (L level), the inside of the control chip 20 transitions to a write-protect state, where writing/erasing data into/in the memory chips 10 is prevented. When receiving the write protect signal WPn via the common WPn terminal 2e, each of the multiple memory chips 10 inhibits writing into memory cells according to the write protect signal WPn under the control of the control chip 20.

Figure 11:
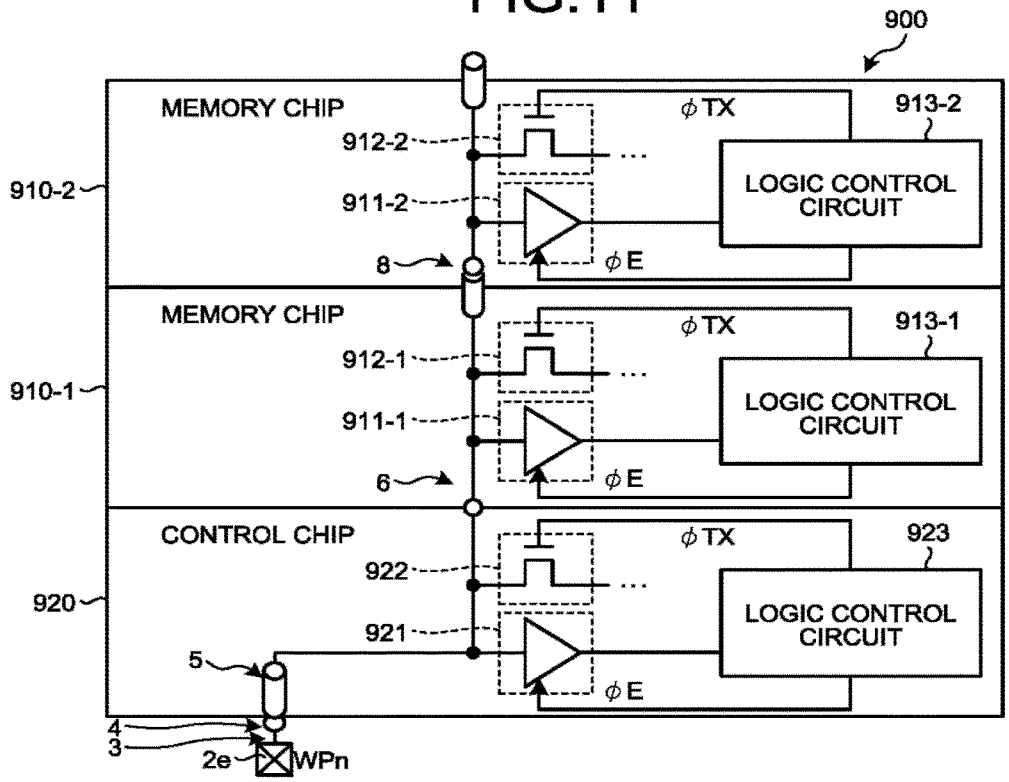
FIG. 11 is a circuit diagram showing the input terminal related configuration of a storage device in basic form.

Consider the case where an input buffer to receive a control signal via an external terminal 2 (input terminal) is provided in each of a control chip 920 and multiple memory chips 910 in a storage device 900. For example, as shown in FIG. 11, input buffers 921, 911-1, 911-2, transfer switches 922, 912-1, 912-2, and logic control circuits 923, 913-1, 913-2 are provided in the control chip 920 and multiple memory chips 910-1, 910-2 respectively. FIG. 11 is a diagram showing the input terminal related configuration of the storage device 900 in basic form. FIG. 11 illustrates the WPn terminal 2e as an input terminal.

The input buffer 921 and the transfer switch 922 are connected to the WPn terminal 2e via a TSV 5, a bump 4, and a land 3. The input buffer 911-1 and the transfer switch 912-1 are connected to the WPn terminal 2e via a bump 6, the TSV 5, the bump 4, and the land 3. The input buffer 911-2 and the transfer switch 912-2 are connected to the WPn terminal 2e via a bump 8, a TSV 7, the bump 6, the TSV 5, the bump 4, and the land 3.

The storage device 900 has a normal operation mode and a test mode and, in the normal operation mode, uses the WPn terminal 2e as an external input terminal for the write protect signal WPn and, in the test mode, uses the WPn terminal 2e as a for-test terminal. That is, the storage device 900 uses the WPn terminal 2e as both the external input terminal and for-test terminal.

In the normal operation mode, the logic control circuits 923, 913-1, 913-2 supply enable signals φE of an active level to the input buffers 921, 911-1, 911-2 and transfer signals φTX of a non-active level to the control terminals of the transfer switches 922, 912-1, 912-2. Thus, the input buffers 921, 911-1, 911-2 become operable, and the write protect signal WPn can be supplied to the logic control circuits 923, 913-1, 913-2 via the input buffers 921, 911-1, 911-2. The transfer switches 922, 912-1, 912-2 are kept in an off state.

The logic control circuits 923, 913-1, 913-2, in the test mode, supply the enable signals φE of the non-active level to the input buffers 921, 911-1, 911-2 and the transfer signals φTX of the active level to the control terminals of the transfer switches 922, 912-1, 912-2. At this time, the logic control circuit 923 selects a chip to be tested from among the control chip 920 and multiple memory chips 910-1, 910-2 and supplies a chip address selection signal of the active level to the logic control circuit of the selected chip. If the chip address selection signal of the control chip 920 is at the active level, the logic control circuits 923 supplies the transfer signal φTX of the active level to the transfer switch 922. If the chip address selection signal of the memory chip 910-1 is at the active level, the logic control circuits 913-1 supplies the transfer signal φTX of the active level to the transfer switch 912-1. If the chip address selection signal of the memory chip 910-2 is at the active level, the logic control circuits 913-2 supplies the transfer signal φTX of the active level to the transfer switch 912-2. Thus, the transfer switch 922, 912-1, 912-2 of the chip selected by the chip address selection signal is turned on, and the inside of the chip can be tested via the WPn terminal 2e and the transfer switch 922, 912-1, 912-2. The input buffers 921, 911-1, 911-2 are in a stopped state.

In this configuration, an equal number of input buffers 921, 911-1, 911-2 and an equal number of transfer switches 922, 912-1, 912-2 to the number of the control chip 920 and memory chips 910-1, 910-2 are electrically connected to the WPn terminal 2e. That is, because the number of elements to be mounted in each memory chip 910-1, 910-2 is large, the chip area of each memory chip 910-1, 910-2 is likely to increase. If the chip area of each memory chip 910-1, 910-2 increases, the package of the storage device 900 (see FIG. 1) becomes large, and thus the cost may increase. Further, because the number of elements connected to the external terminal 2 is large, the capacitance in view from the external terminal 2 is large, so that the consumption current due to charging/discharging that capacitance when the control signal is inputted may increase.

Accordingly, in the first embodiment, in the storage device 100, instead of the respective input buffers of the control chip 20 and multiple memory chips 10-1, 10-2, a common input buffer is placed in the control chip 20 so as to achieve a reduction in the memory chip area and a decrease in power consumption.

Figure 2:
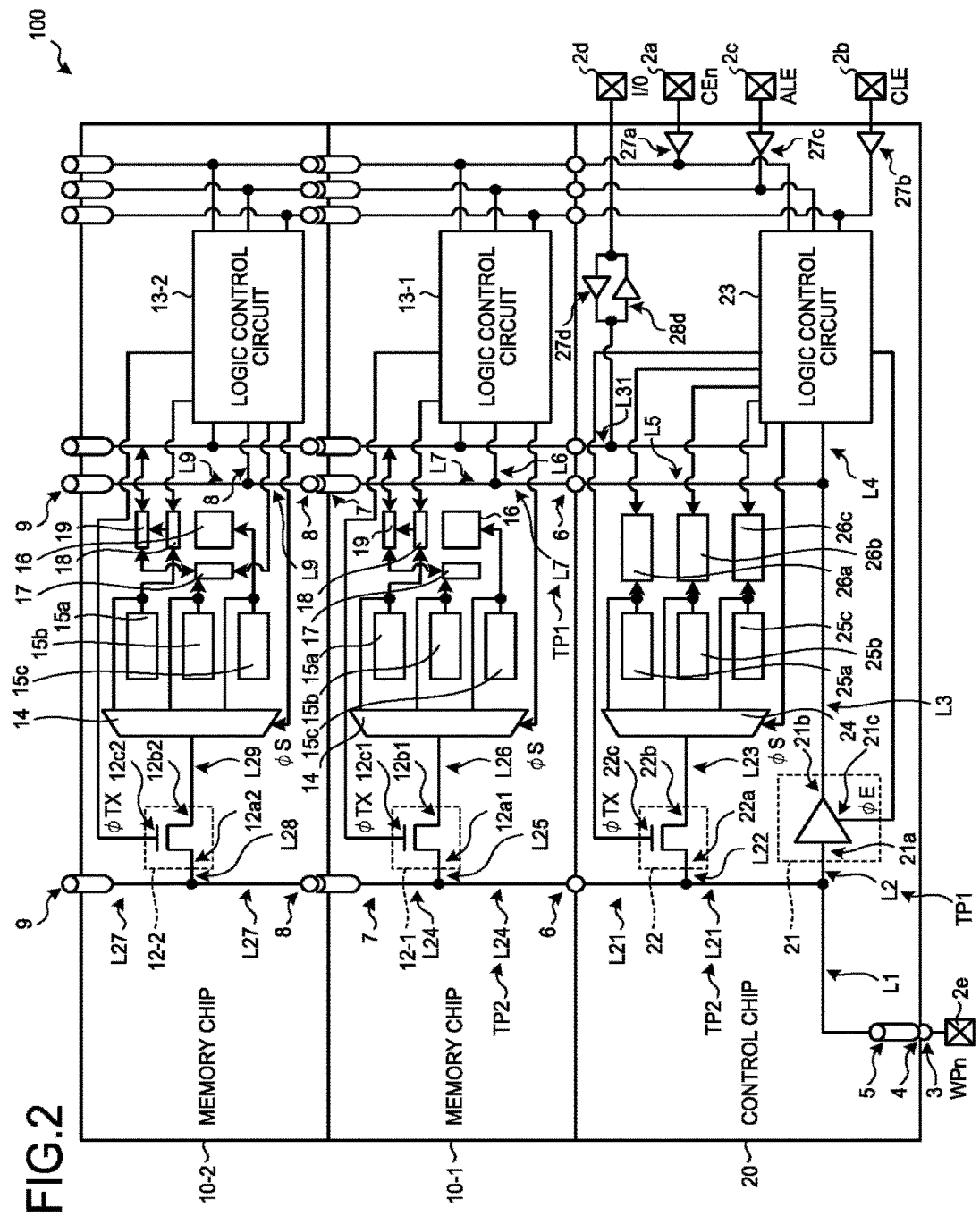
FIG. 2 is a circuit diagram showing the input terminal related configuration of the storage device according to the first embodiment.

FIG. 2 is a circuit diagram showing the input terminal related configuration of the storage device 100. FIG. 2 illustrates the WPn terminal 2e as an input terminal.

The control chip 20 has an input buffer 21, a transfer switch 22, and a logic control circuit 23. The memory chip 10-1 has a transfer switch 12-1 and a logic control circuit 13-1. The memory chip 10-2 has a transfer switch 12-2 and a logic control circuit 13-2.

The input buffer 21 in the control chip 20 is electrically connected to the WPn terminal 2e. The input buffer 21 is common to the control chip 20 and multiple memory chips 10-1, 10-2.

For example, the input buffer 21 has an input node 21a, an output node 21b, and a control node 21c. The input node 21a is connected to the WPn terminal 2e via a line L2, a line L1, a TSV 5, a bump 4, and a land 3. Thus, the input buffer 21 can receive the write protect signal WPn inputted to the WPn terminal 2e.

The output node 21b is connected to the logic control circuit 23 via lines L3 and L4. Thus, the input buffer 21 can supply the write protect signal WPn to the logic control circuit 23.

Further, the output node 21b is connected to the logic control circuit 13-1 via lines L3, L5, a bump 6, and lines L7, L6. Thus, the input buffer 21 can supply the write protect signal WPn to the logic control circuit 13-1 in the memory chip 10-1.

Yet further, the output node 21b is connected to the logic control circuit 13-2 via the lines L3, L5, the bump 6, the line L7, a TSV 7, a bump 8, and lines L9, L8. Thus, the input buffer 21 can supply the write protect signal WPn to the logic control circuit 13-2 in the memory chip 10-2.

The control node 21c is connected to the logic control circuit 23 in the control chip 20. The input buffer 21 goes into an operable state when receiving the enable signal φE of the active level from the logic control circuit 23 at the control node 21c. The input buffer 21 goes into a stopped state when receiving the enable signal φE of the non-active level from the logic control circuit 23 at the control node 21c.

The transfer switch 22 in the control chip 20 is electrically connected to the WPn terminal 2e. For example, the transfer switch 22 has a first node 22a, a second node 22b, and a control node 22c.

The first node 22a is connected to the WPn terminal 2e via lines L22, L21, L1, the TSV 5, the bump 4, and the land 3. Thus, the transfer switch 22 can output a result of monitoring the inside of the chip (an internal voltage monitored value) to the outside via the WPn terminal 2e. Or the transfer switch 22 can receive the for-test signal (a for-test internal voltage) inputted to the WPn terminal 2e.

The second node 22b is electrically connected to an internal circuit (internal voltage related circuit) via a line L23. The internal circuit has, for example, a selector 24, internal voltage generating circuits 25a to 25c, and processing circuits 26a to 26c. The internal voltage generating circuits 25a to 25c generate internal voltages of mutually different levels to supply to the processing circuits 26a to 26c. The processing circuits 26a to 26c perform predetermined processing using the supplied internal voltages under the control of the logic control circuit 23. The selector 24 selects one of the outputs of the internal voltage generating circuits 25a to 25c according to a select signal φS supplied from the logic control circuit 23 to supply to the second node 22b via the line L23. Or the selector 24 supplies the internal voltage supplied via the second node 22b to one of the processing circuits 26a to 26c according to the select signal φS supplied from the logic control circuit 23.

The control node 22c is connected to the logic control circuit 23 in the control chip 20. When receiving a transfer signal φTX of the active level from the logic control circuit 23 at the control node 22c, the transfer switch 22 turns on to make the line L22 and line L23 communicate. When receiving the transfer signal φTX of the non-active level from the logic control circuit 23 at the control node 22c, the transfer switch 22 turns off to make the line L22 and line L23 electrically cut off.

The transfer switch 12-1 in the memory chip 10-1 is electrically connected to the WPn terminal 2e. For example, the transfer switch 12-1 has a first node 12a1, a second node 12b1, and a control node 12c1.

The first node 12a1 is connected to the WPn terminal 2e via lines L25, L24, a bump 6, the lines L21, L1, the TSV 5, the bump 4, and the land 3. Thus, the transfer switch 12-1 can output a result of monitoring the inside of the chip (an internal voltage monitored value) to the outside via the WPn terminal 2e. Or the transfer switch 12-1 can receive the for-test signal (a for-test internal voltage) inputted to the WPn terminal 2e.

The second node 12b1 is electrically connected to an internal circuit (internal voltage related circuit) via a line L26. The internal circuit has, for example, a selector 14, internal voltage generating circuits 15a to 15c, a memory cell array 16, a control circuit 17, a read circuit 18, and a data cache 19. The internal voltage generating circuits 15a to 15c generate internal voltages of mutually different levels to supply to the memory cell array 16, the control circuit 17, and the read circuit 18 respectively. In the memory cell array 16, multiple memory cells are arranged. The internal voltages of mutually different levels include, for example, internal voltages required for writing data into memory cells, reading data from memory cells, and erasing data in memory cells. The selector 14 selects one of the outputs of the internal voltage generating circuits 15a to 15c according to a select signal φS supplied from the logic control circuit 13-1 to supply to the second node 12b1 via the line L26. Or the selector 14 supplies the internal voltage supplied via the second node 12b1 to one of the memory cell array 16, the control circuit 17, and the read circuit 18 according to the select signal φS supplied from the logic control circuit 13-1.

The control node 12c1 is connected to the logic control circuit 13-1 in the memory chip 10-1. When receiving a transfer signal φTX of the active level from the logic control circuit 13-1 at the control node 12c1, the transfer switch 12-1 turns on to make the line L25 and line L26 communicate. When receiving the transfer signal φTX of the non-active level from the logic control circuit 13-1 at the control node 12c1, the transfer switch 12-1 turns off to make the line L25 and line L26 electrically cut off.

The transfer switch 12-2 in the memory chip 10-2 is electrically connected to the WPn terminal 2e. For example, the transfer switch 12-2 has a first node 12a2, a second node 12b2, and a control node 12c2.

The first node 12a2 is connected to the WPn terminal 2e via lines L28, L27, a bump 8, a TSV 7, the line L24, the bump 6, the lines L21, L1, the TSV 5, the bump 4, and the land 3. Thus, the transfer switch 12-2 can output a result of monitoring the inside of the chip (an internal voltage monitored value) to the outside via the WPn terminal 2e. Or the transfer switch 12-2 can receive the for-test signal (a for-test internal voltage) inputted to the WPn terminal 2e.

The second node 12b2 is electrically connected to an internal circuit (internal voltage related circuit) via a line L29. The internal circuit has, for example, a selector 14, internal voltage generating circuits 15a to 15c, a memory cell array 16, a control circuit 17, a read circuit 18, and a data cache 19. The internal voltage generating circuits 15a to 15c generate internal voltages of mutually different levels to supply to the memory cell array 16, the control circuit 17, and the read circuit 18 respectively. In the memory cell array 16, multiple memory cells are arranged. The internal voltages of mutually different levels include, for example, internal voltages required for writing data into memory cells, reading data from memory cells, and erasing data in memory cells. The selector 14 selects one of the outputs of the internal voltage generating circuits 15a to 15c according to a select signal φS supplied from the logic control circuit 13-2 to supply to the second node 12b2 via the line L29. Or the selector 14 supplies the internal voltage supplied via the second node 12b2 to one of the memory cell array 16, the control circuit 17, and the read circuit 18 according to the select signal φS supplied from the logic control circuit 13-2.

The control node 12c2 is connected to the logic control circuit 13-2 in the memory chip 10-2. When receiving a transfer signal φTX of the active level from the logic control circuit 13-2 at the control node 12c2, the transfer switch 12-2 turns on to make the line L28 and line L29 communicate. When receiving the transfer signal φTX of the non-active level from the logic control circuit 13-2 at the control node 12c2, the transfer switch 12-2 turns off to make the line L28 and line L29 electrically cut off.

That is, in the storage device 100, transmission paths TP1 and TP2 are provided between the WPn terminal 2e and the multiple memory chips 10-1, 10-2. The transmission path TP1 is one which goes through the input buffer 21. The transmission path TP2 is one which does not go through the input buffer 21. The transmission path TP1 includes the lines L1, L2, the input buffer 21, the lines L3 to L5, the bump 6, the lines L6, L7, the TSV 7, the bump 8, the lines L8, L9, and the TSV 9. The transmission path TP2 includes the lines L1, L21, L22, the transfer switch 22, the line L23, the bump 6, the lines L24, L25, the transfer switch 12-1, the line L26, the TSV 7, the bump 8, the lines L27, L28, the transfer switch 12-2, the line L29, and the TSV 9.

The storage device 100 has a normal operation mode and a test mode and, in the normal operation mode, uses the WPn terminal 2e as an external input terminal for the write protect signal WPn and, in the test mode, uses the WPn terminal 2e as a for-test terminal. That is, the storage device 100 uses the WPn terminal 2e as both the external input terminal and for-test terminal.

The normal operation mode includes a mode where the write protect signal WPn is supplied through the transmission path TP1 from the WPn terminal 2e to the logic control circuit of each of the control chip 20 and multiple memory chips 10-1, 10-2. The test mode includes a mode where the operation of each of the control chip 20 and multiple memory chips 10-1, 10-2 is checked using the transmission path TP2.

For example, in the normal operation mode (first mode), the logic control circuit 23 of the control chip 20 enables the input buffer 21 so as to activate the transmission path TP1. For example, the logic control circuit 23, in the normal operation mode, supplies the enable signal $\phi E$ of the active level to the control node 21c of the input buffer 21. At this time, the logic control circuits 23, 13-1, 13-2 maintain respectively the transfer switches 22, 12-1, 12-2 in the off state to maintain the transmission path TP2 in a deactivated state. For example, the logic control circuits 23, 13-1, 13-2 maintain the transfer signals $\phi TX$ supplied to the control nodes 22c, 12c1, 12c2 of the transfer switches 22, 12-1, 12-2 at the non-active level.

The logic control circuit 23 of the control chip 20, in the test mode (second mode), disables the input buffer 21 so as to activate the transmission path TP2. For example, the logic control circuits 23, 13-1, 13-2, in the test mode, supply the transfer signals $\phi TX$ of the active level to the control nodes 22c, 12c1, 12c2 of the transfer switches 22, 12-1, 12-2. At this time, the logic control circuit 23 selects a chip to be tested from among the control chip 20 and multiple memory chips 10-1, 10-2 and supplies a chip address selection signal of the active level to the logic control circuit of the selected chip. If the chip address selection signal of the control chip 20 is at the active level, the logic control circuits 23 supplies the transfer signal $\phi TX$ of the active level to the transfer switch 22. If the chip address selection signal of the memory chip 10-1 is at the active level, the logic control circuits 13-1 supplies the transfer signal $\phi TX$ of the active level to the transfer switch 12-1. If the chip address selection signal of the memory chip 10-2 is at the active level, the logic control circuits 13-2 supplies the transfer signal $\phi TX$ of the active level to the transfer switch 12-2. Thus, the transfer switch 22, 12-1, 12-2 of the chip selected by the chip address selection signal is turned on. That is, the chip selected by the chip address selection signal (the control chip 20 or the memory chip 10-1, 0-2) can output a result of monitoring the inside of the chip (an internal voltage monitored value) to the outside via the WPn terminal 2e. Or the chip selected by the chip address selection signal (the control chip 20 or the memory chip 10-1, 10-2) can receive the for-test signal (a for-test internal voltage) inputted to the WPn terminal 2e.

At this time, the logic control circuit 23 maintains the input buffer 21 in a disabled state to maintain the transmission path TP1 in a deactivated state. For example, the logic control circuit 23 maintains the enable signal $\phi E$ supplied to the control node 21c of the input buffer 21 at the non-active level.

The transfer signal $\phi TX$ supplied to the transfer switch 22, 12-1, 12-2 and the enable signal $\phi E$ supplied to the input buffer 21 are at the active level during respective periods which do not overlap. Thus, the logic control circuit 23 of the control chip 20 can activate the transmission paths TP1 and TP2 during respective periods which do not overlap.

As described above, in the first embodiment, in the storage device 100, the input buffer 21 common to the control chip 20 and multiple memory chips 10-1, 10-2 is placed in the control chip 20. Thus, the number of elements to be mounted in each memory chip 10-1, 10-2 can be reduced, so that the chip area of each memory chip 10-1, 10-2 can be reduced. As a result, the package of the storage device 100 (see FIG. 1) can be easily made smaller, so that the cost of the storage device 100 can be reduced. Further, as compared with the case where the input buffer is provided in each of the control chip 20 and multiple memory chips 10-1, 10-2 (see FIG. 11), the number of input buffers connected to the external terminal 2 (an input terminal) can be decreased. As a result, the capacitance in view from the external terminal 2 can be made smaller, so that the consumption current due to charging/discharging that capacitance when a signal is inputted can be reduced.

Further, in the first embodiment, in the storage device 100, the transmission path TP1 going through the input buffer 21 and the transmission path TP2 not going through the input buffer 21 are provided between the external terminal 2 and the multiple memory chips 10-1, 10-2. The control chip 20, in the normal operation mode, enables the input buffer 21 so as to activate the transmission path TP1 and, in the test mode, disables the input buffer 21 so as to activate the transmission path TP2. Thus, also in the case where the input buffer 21 is made common to the control chip 20 and multiple memory chips 10-1, 10-2, the external terminal 2 (the WPn terminal 2e) can be used as both an external input terminal and for-test terminal. Therefore, the need for adding a for-test terminal to the storage device 100 is reduced, so that an increase in the number of terminals of the storage device 100 can be suppressed and that an increase in the cost of the storage device 100 can be suppressed.

It should be noted that, although FIG. 2 illustrates the input buffer 21 to receive the write protect signal WPn, the concept of the first embodiment can be applied to input buffers to receive other control signals likewise.

For example, as shown in FIG. 2, an input buffer 27a to receive the chip enable signal CEn from the CEn terminal 2a, which buffer is made common to the control chip 20 and multiple memory chips 10, can be placed in the control chip 20. Further, if the CEn terminal 2a is used as both an external input terminal and for-test terminal, a configuration corresponding to the transmission path TP2 can be additionally connected to the input side of the input buffer 27a.

Or, for example, an input buffer 27b to receive a command latch enable signal CLE from the CLE terminal 2b, which buffer is made common to the control chip 20 and multiple memory chips 10, can be placed in the control chip 20. Further, if the CLE terminal 2b is used as both an external input terminal and for-test terminal, a configuration corresponding to the transmission path TP2 can be additionally connected to the input side of the input buffer 27b.

Or, for example, an input buffer 27c to receive an address latch enable signal ALE from the ALE terminal 2c, which buffer is made common to the control chip 20 and multiple memory chips 10, can be placed in the control chip 20. Further, if the ALE terminal 2c is used as both an external input terminal and for-test terminal, a configuration corresponding to the transmission path TP2 can be additionally connected to the input side of the input buffer 27c.

Further, the concept of the first embodiment can be applied to an I/O terminal 2d as well. For example, a pair of an input buffer 27d and an output buffer 28d to transfer I/O signals to/from the I/O terminal 2d, which pair is made common to the control chip 20 and multiple memory chips 10, can be placed in the control chip 20. The input buffer 27d and output buffer 28d are connected in parallel between the I/O terminal 2d and an I/O line L31.

Yet further, in the test mode, the storage device 100 may check the threshold voltages of memory cells in each memory chip 10-1, 10-2. For example, each of the control chip 20 and multiple memory chips 10-1, 10-2 receives the chip enable signal CEn of the active level via the CEn terminal 2a to set all the functions of the chip to be valid. Each memory chip 10-1, 10-2 receives the command latch enable signal CLE of the active level via the CLE terminal 2b to enable the chip to accept commands. Each memory chip 10-1, 10-2 receives the address latch enable signal ALE of the active level via the ALE terminal 2c to enable the chip to accept addresses. Each memory chip 10-1, 10-2 receives via the I/O terminal 2d a command and address to check the threshold voltages of memory cells and selects memory cells in the memory cell array 16 according to the command and address. The control chip 20 activates the transmission path TP2 when in the test mode. While in this state, a write voltage to be applied to memory cells is applied to the selected memory cells through the transfer switch 12-1, 12-2 via the WPn terminal 2e. Then data written into the selected memory cells is read to the outside via the I/O terminal 2d. Thus, the threshold voltages of memory cells can be checked.

Figure 3:
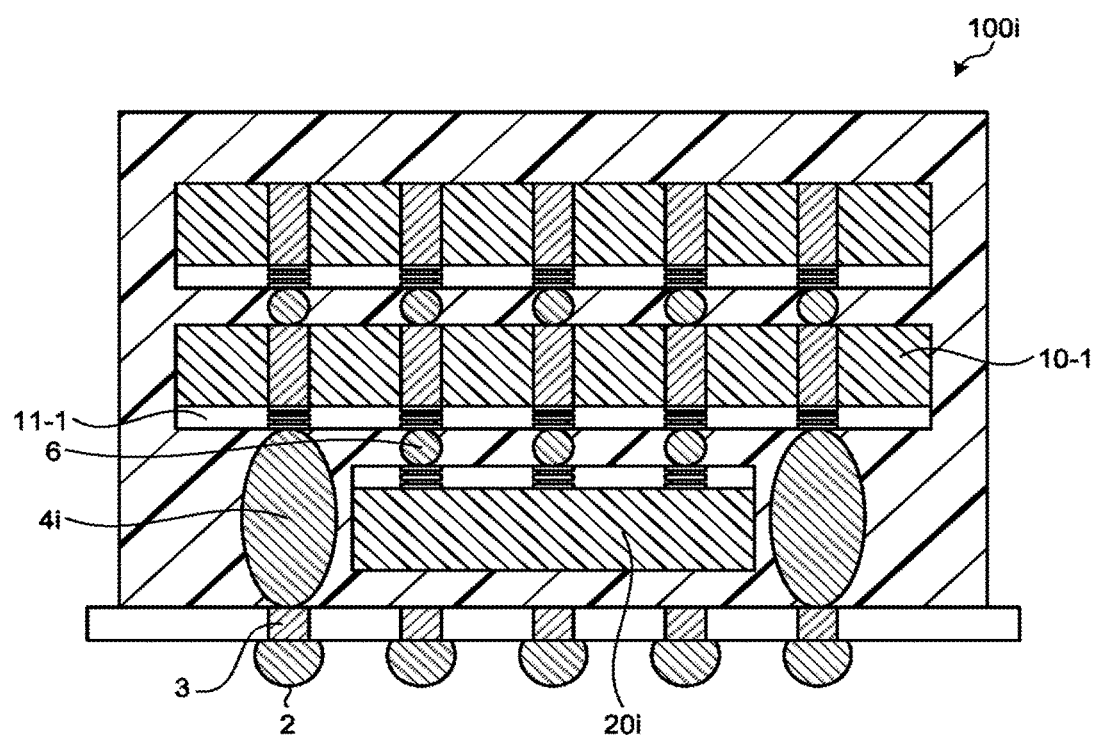
FIG. 3 is a cross-sectional view showing the configuration of a storage device according to a modified example of the first embodiment.
Figure 4:
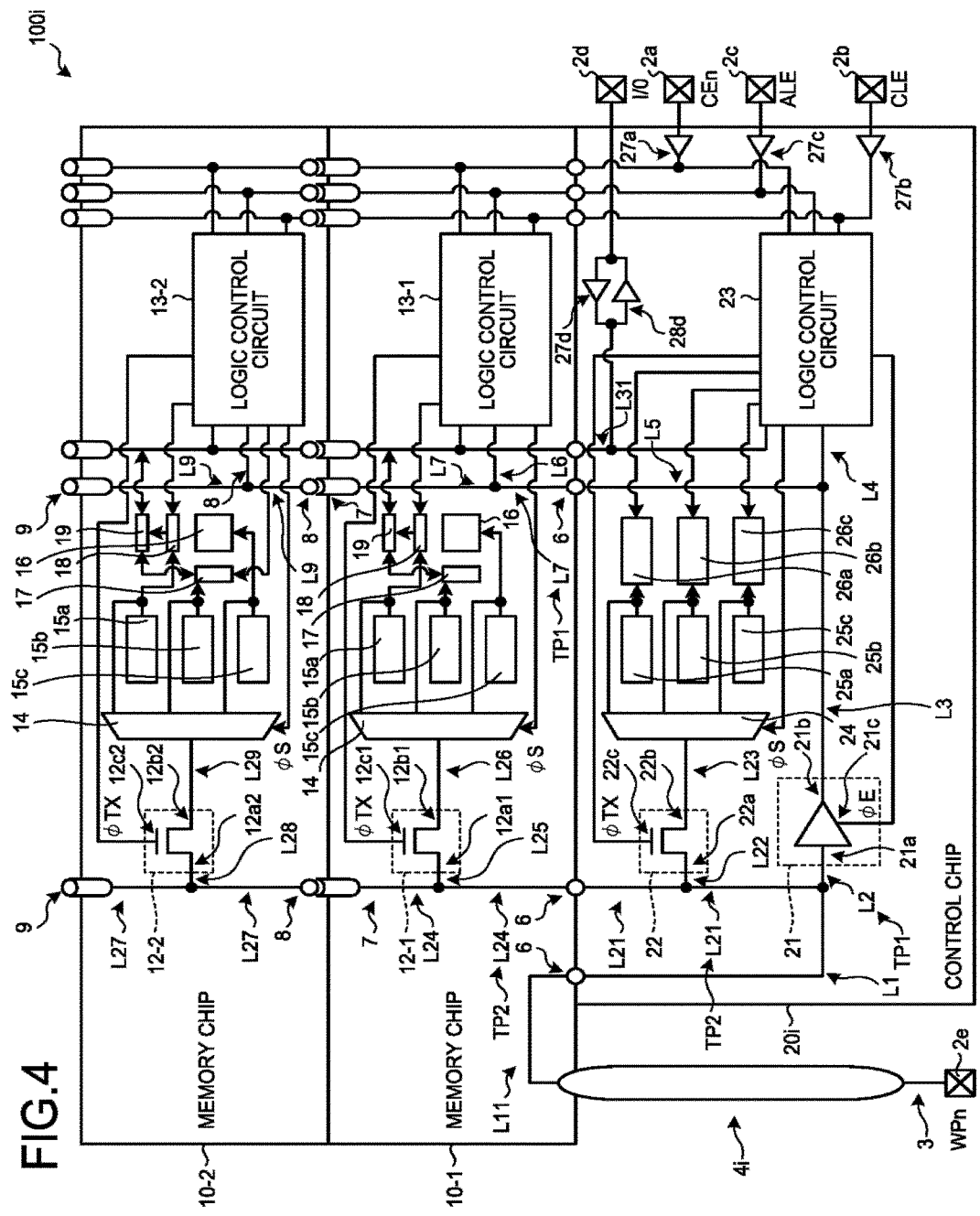
FIG. 4 is a circuit diagram showing the input terminal related configuration of the storage device according to the modified example of the first embodiment.

Or a storage device 100i may have a configuration in which the plan size of the control chip 20i is smaller than that of the memory chip 10-1 with the TSVs 5 (see FIG. 1) being omitted as shown in FIG. 3. FIG. 3 is a cross-sectional view showing the configuration of the storage device 100i. In this case, for example, the external terminals 2 are connected with elements in the control chip 20i via lands 3, bumps 4i, multi-layer lines 21, and bumps 6. The bump 4i has a height corresponding to that of the bump 6 plus the thickness of the control chip 20i and electrically connects a land 3 and a multi-layer line 21. For example, a line L1 in the control chip 20i may be connected to the WPn terminal 2e via a bump 6, a line L11, a bump 4i, and a land 3 as shown in FIG. 4. FIG. 4 is a circuit diagram showing the input terminal related configuration of the storage device 100i. Also in this case, the number of elements to be mounted in each memory chip 10-1, 10-2 can be reduced, so that the chip area of each memory chip 10-1, 10-2 can be reduced. Further, as compared with the case where the input buffer is provided in each of the control chip 20i and multiple memory chips 10-1, 10-2 (see FIG. 11), the number of input buffers connected to the external terminal 2 (an input terminal) can be decreased.

Second Embodiment

Next, a storage device 200 according to the second embodiment will be described. A description will be made below focusing on parts in which it is different from the first embodiment.

Although in the first embodiment an equal number of switches to the number of chips are connected to the WPn terminal 2e, in the second embodiment a tactic to reduce the number of switches connected to the WPn terminal 2e is implemented.

Figure 5:
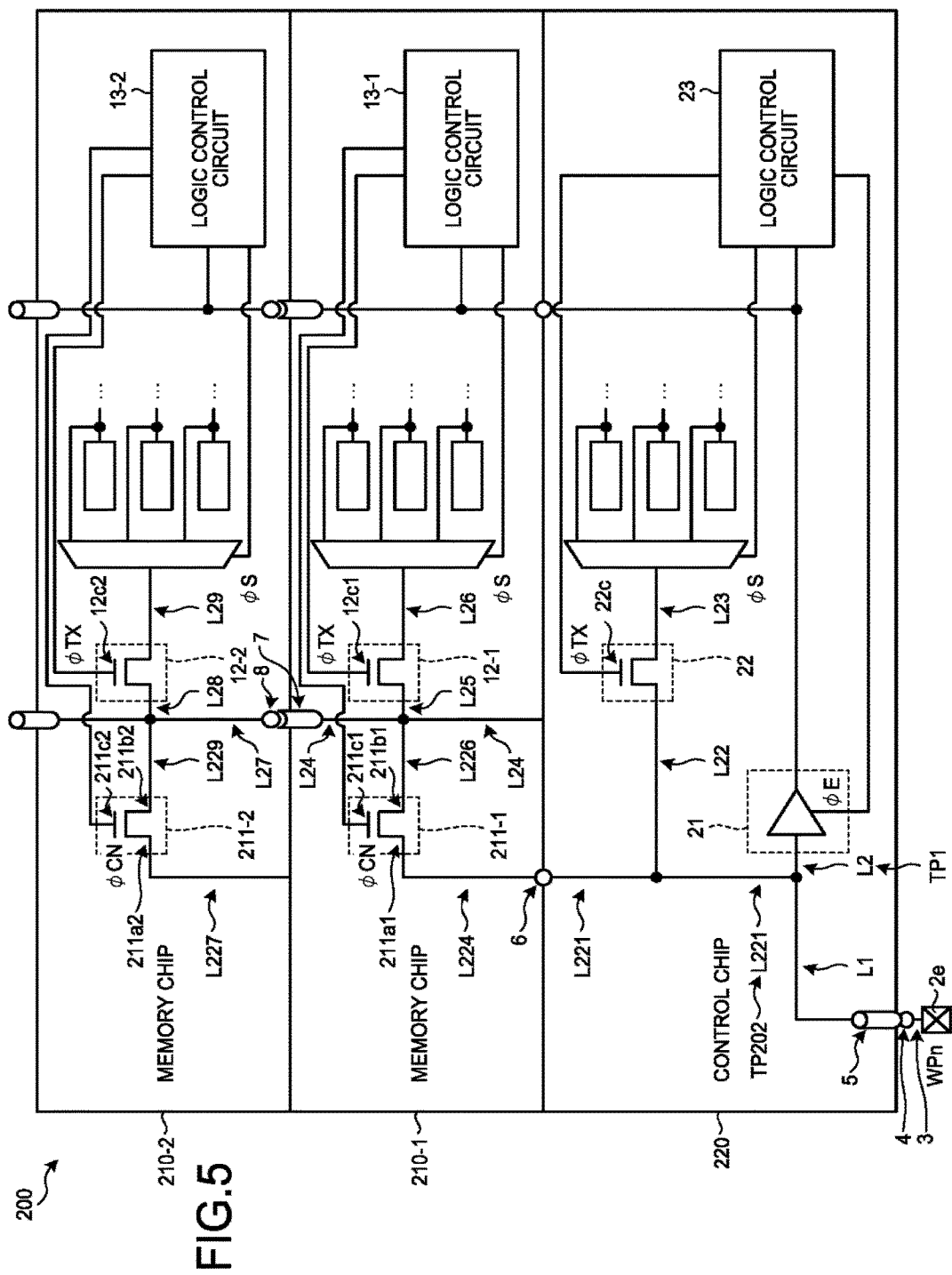
FIG. 5 is a circuit diagram showing the input terminal related configuration of a storage device according to a second embodiment.

FIG. 5 is a circuit diagram showing the configuration of the storage device 200. The memory chip 210-2 further has a connection switch 211-2.

A connection switch 211-1 in the memory chip 210-1 is electrically connected between the WPn terminal 2e and the transfer switches 12-1, 12-2 of the memory chips 210-1, 210-2.

For example, the connection switch 211-1 has a first node 211a1, a second node 211b1, and a control node 211c1.

The first node 211a1 is connected to the WPn terminal 2e via a line L224, a bump 6, lines L221, L1, a TSV 5, a bump 4, and a land 3. Thus, the connection switch 211-1 can output a monitoring result (an internal voltage monitored value) transferred via the transfer switch 12-1, 12-2 to the outside via the WPn terminal 2e. Or the connection switch 211-1 can transfer the for-test signal (a for-test internal voltage), inputted to the WPn terminal 2e, to the transfer switch 12-1, 12-2.

The second node 211b1 is connected to the transfer switch 12-1 via lines L226, L25. Thus, the connection switch 211-1 can receive a monitoring result (an internal voltage monitored value) transferred via the transfer switch 12-1. Or the connection switch 211-1 can transfer the for-test signal (a for-test internal voltage), inputted to the WPn terminal 2e, to the transfer switch 12-1.

The second node 211b1 is connected to the transfer switch 12-2 via lines L226, L24, a TSV 7, a bump 8, and lines L27, L28. Thus, the connection switch 211-1 can receive a monitoring result (an internal voltage monitored value) transferred via the transfer switch 12-2. Or the connection switch 211-1 can transfer the for-test signal (a for-test internal voltage), inputted to the WPn terminal 2e, to the transfer switch 12-2.

The control node 211c1 is connected to the logic control circuit 13-1 in the memory chip 210-1. When receiving a connection signal ϕCN of the active level from the logic control circuit 13-1 at the control node 211c1, the connection switch 211-1 turns on to make the line L224 and line L226 communicate. That is, the connection switch 211-1 makes the WPn terminal 2e and the transfer switches 12-1, 12-2 communicate. When receiving the connection signal ϕCN of the non-active level from the logic control circuit 13-1 at the control node 211c1, the connection switch 211-1 turns off to make the line L224 and line L226 electrically cut off. That is, the connection switch 211-1 makes the WPn terminal 2e and the transfer switches 12-1, 12-2 electrically cut off.

With its one end floating, the connection switch 211-2 in the memory chip 210-2 is not used in signal transmission, but is provided corresponding to the connection switch 211-1 in the memory chip 210-1. Thus, the same configuration can be used for the memory chips 210-1, 210-2, so that the production cost of the memory chips 210-1, 210-2 can be reduced.

For example, the connection switch 211-2 has a first node 211a2, a second node 211b2, and a control node 211c2. The first node 211a2 is connected to a line L227 to be floating. The second node 211b2 is connected to the transfer switch 12-2 via lines L229, L28. Further, the second node 211b2 is connected to the transfer switch 12-1 via the lines L229, L27, the bump 8, the TSV 7, and the lines L24, L25. The control node 211c2 is connected to the logic control circuit 13-2 in the memory chip 210-2.

In the control chip 220, the wiring is changed to correspond to the connection switch 211-1 of the memory chip 210-1 that is the lowest of the memory chips 210-1, 210-2. That is, in the control chip 220, the line L221 is provided instead of the line L21 (see FIG. 2). The line L221 is connected to the bump 6 connected to the line L224 instead of a bump 6 connected to the line L24 (see FIG. 2).

In the storage device 200, the transmission path TP202 not going through the input buffer 21 includes the line L221 instead of the line L21 (see FIG. 2) and further includes the line L224, the connection switch 211-1, and the line L226.

The logic control circuit 23 of the control chip 220, in the test mode (second mode), disables the input buffer 21 so as to activate the transmission path TP202. For example, the logic control circuit 13-1 of the memory chip 210-1, in the test mode, supplies the connection signal φCN of the active level to the control node 211c1 of the connection switch 211-1. Further, the logic control circuit 23, 13-1, 13-2 of the chip selected by the chip address selection signal, in the test mode, supplies the transfer signal φTX of the active level to the control node 22c, 12c1, 12c2 of the transfer switch 22, 12-1, 12-2. Thus, the transfer switch 22, 12-1, 12-2 of the chip selected by the chip address selection signal is turned on. That is, the chip selected by the chip address selection signal (the control chip 220 or the memory chip 210-1, 210-2) can output a result of monitoring the inside of the chip (an internal voltage monitored value) to the outside via the WPn terminal 2e. Or the chip selected by the chip address selection signal (the control chip 220 or the memory chip 210-1, 210-2) can receive the for-test signal (a for-test internal voltage) inputted to the WPn terminal 2e.

As described above, in the second embodiment, in the storage device 200, the connection switch 211-1 is electrically connected between the WPn terminal 2e and the transfer switches 12-1, 12-2 of the memory chips 210-1, 210-2. Thus, the number of switches electrically connected to the WPn terminal 2e can be reduced to two, referring to the transfer switch 22 and the connection switch 211-1. That is, the number of switches connected to the external terminal (an input terminal) can be reduced as compared with the first embodiment. As a result, the capacitance in view from the external terminal 2 can be made further smaller, so that the consumption current due to charging/discharging that capacitance when a signal is inputted can be further reduced.

Further, in the second embodiment, in the storage device 200, the connection switch 211-1 is provided on the transmission path TP202 and electrically connects the external terminal 2 (an input terminal) to the transfer switches 12-1, 12-2. The logic control circuit 13-1, in the normal operation mode, maintains at least the connection switch 211-1 in the off state. Thus, in the normal operation mode, the transmission path TP202 can be deactivated. The logic control circuit 13-1, in the test mode, turns on the connection switch 211-1, and the logic control circuits 23, 13-1, 13-2, in the test mode, turn on the transfer switches 22, 12-1, 12-2. Thus, where the number of switches electrically connected to the WPn terminal 2e is reduced, the operation necessary in the test mode can be performed.

Third Embodiment

Next, a storage device 300 according to the third embodiment will be described. A description will be made below focusing on parts in which it is different from the second embodiment.

While in the second embodiment a tactic to reduce the number of switches connected to the WPn terminal 2e is implemented, in the third embodiment a tactic to further reduce the number of switches connected to the WPn terminal 2e is implemented.

Figure 6:
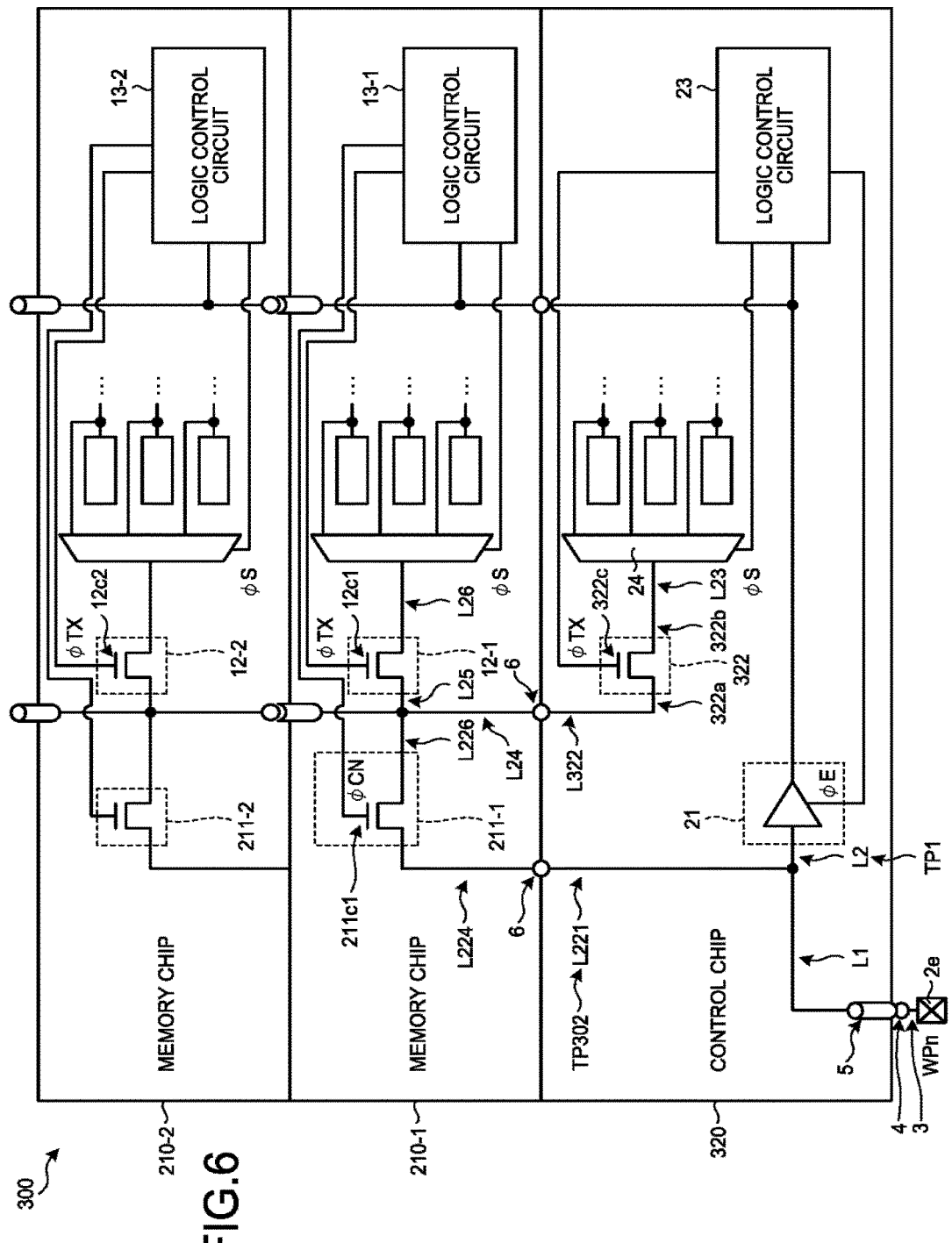
FIG. 6 is a circuit diagram showing the input terminal related configuration of a storage device according to a third embodiment.

Specifically, in the storage device 300, as shown in FIG. 6, the control chip 320 has a transfer switch 322 instead of the transfer switch 22 (see FIG. 5). FIG. 6 is a circuit diagram showing the configuration of the storage device 300. The transfer switch 322 is electrically connected between the connection switch 211-1 and an internal circuit (e.g., the selector 24) of the control chip 320. Accordingly, instead of the line L22 (see FIG. 5) a line L322 is provided in the control chip 320. The line L322 is connected to the bump 6 connected to the line L24.

For example, the transfer switch 322 has a first node 322a, a second node 322b, and a control node 322c.

The first node 322a is connected to the connection switch 211-1 via the line L322, a bump 6, and lines L24, L226. Thus, the transfer switch 322 can output a result of monitoring the inside of the chip (an internal voltage monitored value) to the outside via the WPn terminal 2e. Or the transfer switch 322 can receive the for-test signal (a for-test internal voltage) inputted to the WPn terminal 2e via the connection switch 211-1.

The second node 322b is electrically connected to an internal circuit (internal voltage related circuit) via a line L23.

The control node 322c is connected to the logic control circuit 23 in the control chip 320. When receiving a transfer signal φTX of the active level from the logic control circuit 23 at the control node 322c, the transfer switch 322 turns on to make the line L322 and line L23 communicate. When receiving the transfer signal φTX of the non-active level from the logic control circuit 23 at the control node 322c, the transfer switch 322 turns off to make the line L322 and line L23 electrically cut off.

In the storage device 300, the transmission path TP302 not going through the input buffer 21 includes the line L322 and the transfer switch 322 instead of the line L22 and the transfer switch (see FIG. 5).

The logic control circuit 23 of the control chip 320, in the test mode (second mode), disables the input buffer 21 so as to activate the transmission path TP302. For example, the logic control circuit 13-1 of the memory chip 210-1, in the test mode, supplies the connection signal φCN of the active level to the control node 211c1 of the connection switch 211-1. Further, the logic control circuit 23, 13-1, 13-2 of the chip selected by the chip address selection signal, in the test mode, supplies the transfer signal φTX of the active level to the control node 322c, 12c1, 12c2 of the transfer switch 322, 12-1, 12-2. Thus, the transfer switch 22, 12-1, 12-2 of the chip selected by the chip address selection signal is turned on. That is, the chip selected by the chip address selection signal (the control chip 320 or the memory chip 210-1, 210-2) can output a result of monitoring the inside of the chip (an internal voltage monitored value) to the outside via the WPn terminal 2e. Or the chip selected by the chip address selection signal (the control chip 320 or the memory chip 210-1, 210-2) can receive the for-test signal (a for-test internal voltage) inputted to the WPn terminal 2e.

As described above, in the third embodiment, in the storage device 300, the transfer switch 322 of the control chip 320 is electrically connected between the connection switch 211-1 and an internal circuit of the control chip 320. Thus, the number of switches electrically connected to the WPn terminal 2e can be reduced to one, referring to the connection switch 211-1. That is, the number of switches connected to the external terminal 2 (an input terminal) can be reduced as compared with the second embodiment. As a result, the capacitance in view from the external terminal 2 can be made further smaller, so that the consumption current due to charging/discharging that capacitance when a control signal is inputted can be further reduced.

Fourth Embodiment

Next, a storage device 400 according to the fourth embodiment will be described. A description will be made below focusing on parts in which it is different from the second embodiment.

While in the second embodiment a tactic to reduce the number of switches connected to the WPn terminal 2e is implemented, in the fourth embodiment a tactic to further reduce the number of switches connected to the WPn terminal 2e is implemented.

Figure 7:
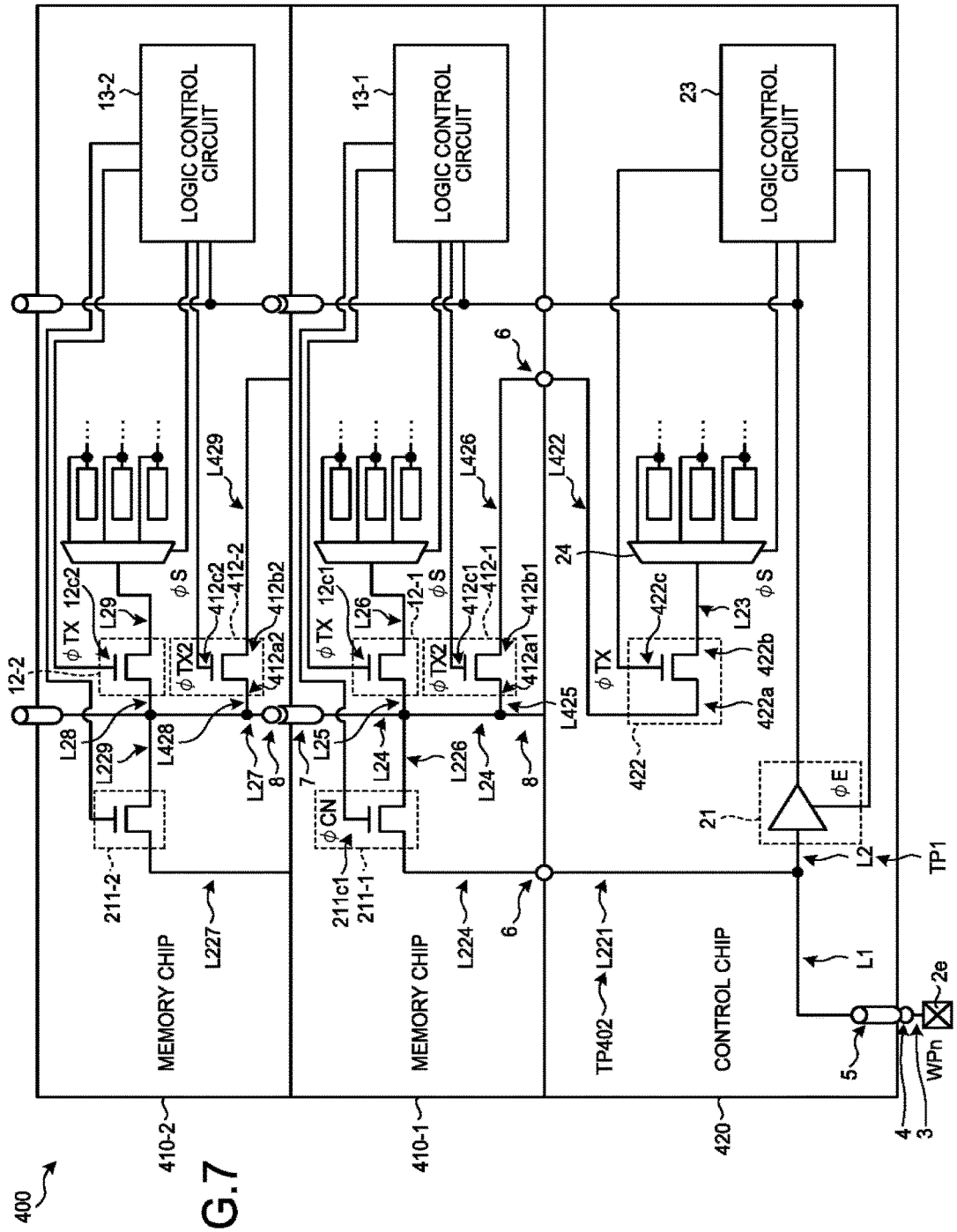
FIG. 7 is a circuit diagram showing the input terminal related configuration of a storage device according to a fourth embodiment.

Specifically, in the storage device 400, as shown in FIG. 7, the control chip 420 has a transfer switch 422 instead of the transfer switch 22 (see FIG. 5). FIG. 7 is a circuit diagram showing the configuration of the storage device 400. The memory chip 410-1 further has a transfer switch 412-1. The memory chip 410-2 further has a transfer switch 412-2.

The transfer switch 422 in the control chip 420 is electrically connected between the transfer switch 412-1 and an internal circuit (e.g., the selector 24) of the control chip 420. Accordingly, instead of the line L22 (see FIG. 5), a line L422 is provided in the control chip 420. The line L422 is connected to the bump 6 connected to a line L426.

For example, the transfer switch 422 has a first node 422a, a second node 422b, and a control node 422c.

The first node 422a is connected to the connection switch 211-1 via the line L422, a bump 6, the line L426, a transfer switch 412-1, and lines L425, L24, L226. The second node 422b is electrically connected to an internal circuit (internal voltage related circuit) via a line L23. Thus, the transfer switch 422 can output a result of monitoring the inside of the chip (an internal voltage monitored value) through the transfer switch 412-1 and the connection switch 211-1 via the WPn terminal 2e to the outside. Or the transfer switch 422 can receive the for-test signal (a for-test internal voltage) inputted to the WPn terminal 2e via the connection switch 211-1 and the transfer switch 412-1.

The control node 422c is connected to the logic control circuit 23 in the control chip 420. When receiving a transfer signal φTX of the active level from the logic control circuit 23 at the control node 422c, the transfer switch 422 turns on to make the line L422 and line L23 communicate. When receiving the transfer signal φTX of the non-active level from the logic control circuit 23 at the control node 422c, the transfer switch 422 turns off to make the line L422 and line L23 electrically cut off.

The transfer switch 412-1 in the memory chip 410-1 is electrically connected between the connection switch 211-1 and the transfer switch 422. For example, the transfer switch 412-1 has a first node 412a1, a second node 412b1, and a control node 412c1.

The first node 412a1 is connected to the connection switch 211-1 via the lines L426, L24, L226. The second node 412b1 is electrically connected to the transfer switch 422 via the line L426, the bump 6, and the L422. Thus, the transfer switch 412-1 can output a monitoring result (an internal voltage monitored value) transferred via the transfer switch 422 to the outside through the connection switch 211-1 via the WPn terminal 2e. Or the transfer switch 412-1 can transfer the for-test signal (a for-test internal voltage), inputted to the WPn terminal 2e and received by the connection switch 211-1, to the transfer switch 422.

The control node 412c1 is connected to the logic control circuit 13-1 in the control chip 410-1. When receiving a transfer signal φTX2 of the active level from the logic control circuit 13-1 at the control node 412c1, the transfer switch 412-1 turns on to make the line L425 and line L426 communicate. When receiving the transfer signal φTX2 of the non-active level from the logic control circuit 13-1 at the control node 412c1, the transfer switch 412-1 turns off to make the line L425 and line L426 electrically cut off.

With its one end floating, the transfer switch 412-2 in the memory chip 410-2 is not used in signal transmission, but is provided corresponding to the transfer switch 412-1 in the memory chip 410-1. That, it is provided so as to make the memory chips 410-1, 410-2 have the same configuration to reduce the production cost.

For example, the transfer switch 412-2 has a first node 412a2, a second node 412b2, and a control node 412c2. The first node 412a2 is connected to the connection switch 211-1 via lines L428, L27, a bump 8, a TSV 7, and the lines L24, L226. The second node 412b2 is connected to the line L429 to be floating. The control node 412c2 is connected to the logic control circuit 13-2 in the memory chip 410-2.

In the storage device 400, the transmission path TP402 not going through the input buffer 21 includes the line L422 and the transfer switch 422 instead of the line L22 and the transfer switch 22 (see FIG. 5) and further includes the line L425, the transfer switch 412-1, and the line L426.

The logic control circuit 23 of the control chip 420, in the test mode (second mode), disables the input buffer 21 so as to activate the transmission path TP402. For example, the logic control circuit 13-1 of the memory chip 410-1, in the test mode, supplies the connection signal φCN of the active level to the control node 211c1 of the connection switch 211-1. Further, the logic control circuit 23, 13-1, 13-2 of the chip selected by the chip address selection signal, in the test mode, supplies the transfer signal φTX of the active level to the control node 422c, 12c1, 12c2 of the transfer switch 422, 12-1, 12-2. The logic control circuit 13-1 supplies the transfer signal φTX2 of the active level to the transfer switch 412-1 during the time that the transfer signal φTX for the transfer switch 422 is at the active level. Thus, the transfer switch 422, 12-1, 12-2 of the chip selected by the chip address selection signal is turned on. That is, the chip selected by the chip address selection signal (the control chip 420 or the memory chip 410-1, 410-2) can output a result of monitoring the inside of the chip (an internal voltage monitored value) to the outside via the WPn terminal 2e. Or the chip selected by the chip address selection signal (the control chip 420 or the memory chip 410-1, 410-2) can receive the for-test signal (a for-test internal voltage) inputted to the WPn terminal 2e.

As described above, in the fourth embodiment, in the storage device 400, the transfer switch 422 of the control chip 420 is electrically connected between the connection switch 211-1 and an internal circuit of the control chip 420 via the transfer switch 412-1. Thus, the number of switches electrically connected to the WPn terminal 2e can be reduced to one, referring to the connection switch 211-1. That is, the number of switches connected to the external terminal 2 (an input terminal) can be reduced as compared with the second embodiment. As a result, the capacitance in view from the external terminal 2 can be made further smaller, so that the consumption current due to charging/discharging that capacitance when a control signal is inputted can be further reduced.

The control chip 420 may have a configuration in which the transfer switch 422 is omitted with the line L422 and the line L23 being connected. Also in this case, the transfer switch 412-1 is electrically connected between the connection switch 211-1 and an internal circuit of the control chip 420, and thus, the number of switches electrically connected to the WPn terminal 2e can be reduced to one, referring to the connection switch 211-1.

Fifth Embodiment

Next, a storage device 500 according to the fifth embodiment will be described. A description will be made below focusing on parts in which it is different from the first embodiment.

Although in the first embodiment a tactic intended for an input terminal is implemented, in the fifth embodiment a tactic intended for an output terminal is implemented.

Figure 8:
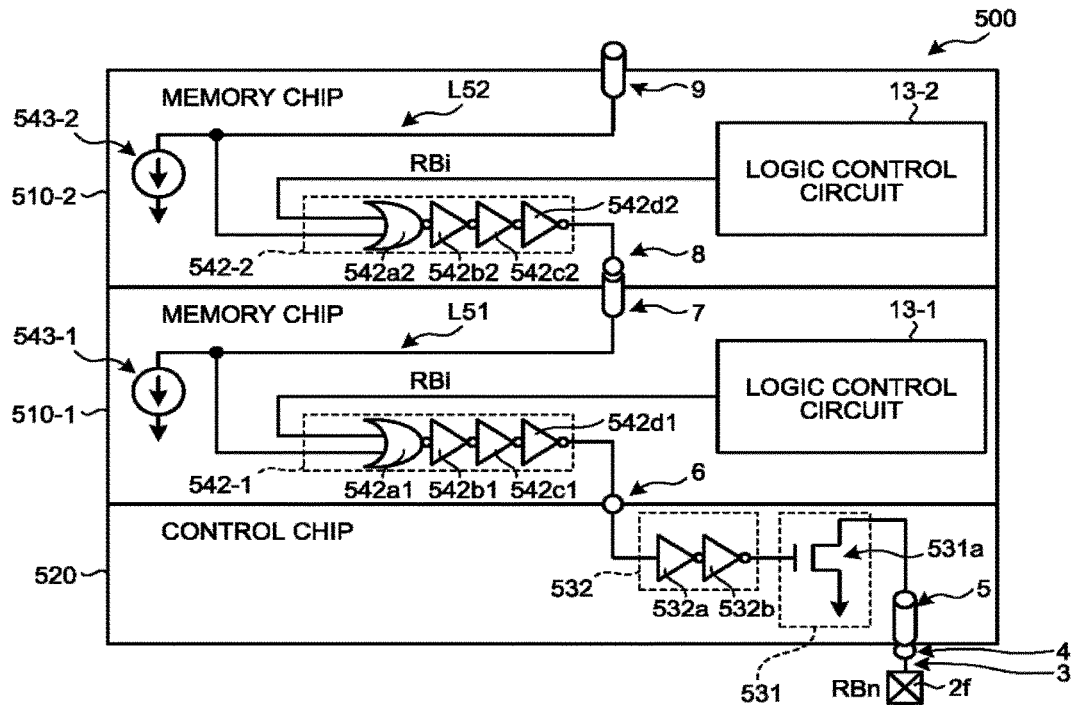
FIG. 8 is a circuit diagram showing the output terminal related configuration of a storage device according to a fifth embodiment.

In the storage device 500, each of multiple memory chips 510 outputs an output signal through a control chip 520 via a common external terminal 2 (an output terminal) to the outside. For example, as shown in FIG. 8, each of multiple memory chips 510-1, 510-2 outputs a ready/busy signal indicating the state of access to the memory cell array 16 through the control chip 520 via an RBn terminal 2f to the outside. FIG. 8 is a circuit diagram showing the configuration of the storage device 500.

Figure 12:
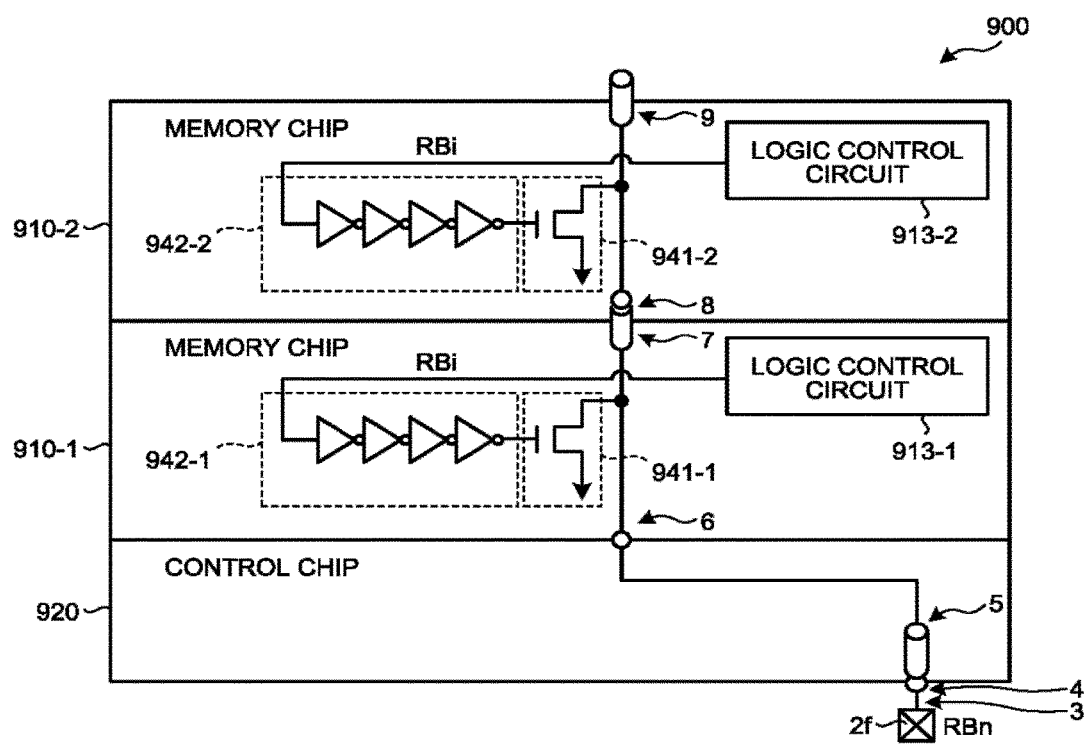
FIG. 12 is a circuit diagram showing the output terminal related configuration of the storage device in basic form.

Consider the case where an output driver of each memory chip 910 in a storage device 900 is connected to an external terminal (an output terminal). For example, as shown in FIG. 12, output drivers 941-1, 941-2, drive circuits 942-1, 942-2, and logic control circuits 913-1, 913-2 are provided in multiple memory chips 910-1, 910-2 respectively. FIG. 12 is a diagram showing the output terminal related configuration of the storage device 900 in basic form. FIG. 12 illustrates the RBn terminal 2f as an output terminal.

The drive circuits 942-1, 942-2 include multiple inverters connected in series and are configured to transfer internal ready/busy signals RBi received from the logic control circuits 913-1, 913-2 to the output drivers 941-1, 941-2.

The output driver 941-1 is connected to the RBn terminal 2f via a bump 6, a TSV 5, a bump 4, and a land 3. The output driver 941-2 is connected to the RBn terminal 2f via a bump 8, a TSV 7, the bump 6, the TSV 5, the bump 4, and the land 3. In this configuration, an equal number of output drivers 941-1, 941-2 to the number of the memory chips 910-1, 910-2 are electrically connected to the RBn terminal 2f. That is, because the number of elements connected to the external terminal 2 is large, the capacitance in view from the external terminal 2 is large, so that the consumption current due to charging/discharging that capacitance when a signal is outputted may increase.

Accordingly, in the fifth embodiment, in the storage device 500, instead of the respective output drivers of the multiple memory chips 510-1, 510-2, a common output driver is placed in the control chip 520 so as to achieve a reduction in the memory chip area and a decrease in power consumption.

Specifically, the control chip 520 has a drive circuit 532 and an output driver 531. The memory chip 510-1 has a drive circuit 542-1. The memory chip 510-2 has a drive circuit 542-2. Each of the multiple memory chips 510-1, 510-2 is configured to put together a signal transferred from the memory chip adjacent above and a signal transferred from the logic control circuit so as to transfer to the memory chip adjacent below. The output driver 531 outputs a ready/busy signal RBn according to the internal ready/busy signal RBi transferred from the memory chip 510-1 that is the lowest of the multiple memory chips 510-1, 510-2 to the RBn terminal 2f.

The drive circuit 542-1 in the memory chip 510-1 is electrically connected to the output driver 531 via the drive circuit 532. Thus, the drive circuit 542-1 can output the internal ready/busy signal RBi received from the logic control circuit 13-1 to the RBn terminal 2f via the drive circuit 532 and the output driver 531. Note that a constant current source 543-2 is electrically connected between a node on a line L51, between the drive circuit 542-1 and a TSV 7, and a reference potential VSS (e.g. ground potential). The line L51 electrically connects the drive circuit 542-1 and the TSV 7. The constant current source 543-1 discharges the line L51 to render the potential on the line L51 low (L) (the reference potential VSS) when no signal exists on the line L51.

The drive circuit 542-1 is electrically connected between the drive circuit 542-2 and the output driver 531 via the drive circuit 532. Thus, the drive circuit 542-1 can output the internal ready/busy signal RBi received from the memory chip 510-2 to the RBn terminal 2f via the drive circuit 532 and the output driver 531.

For example, the drive circuit 542-1 has a NOR gate 542a1 and an odd number of stages of inverters 542b1 to 542d1, which are connected in series. The NOR gate 542a1 carries out a NOT-OR operation on the internal ready/busy signal RBi received from the logic control circuit 13-1 and the internal ready/busy signal RBi received from the memory chip 510-2 to transfer the result to the inverter 542b1. Both the internal ready/busy signal RBi received from the logic control circuit 13-1 and the internal ready/busy signal RBi received from the memory chip 510-2 are an active high signal. Hence, the NOR gate 542a1 functions as a gate to logically invert at least one internal ready/busy signal RBi that is active and to transfer. Each inverter 542b1 to 542d1 logically inverts the transferred internal ready/busy signal RBi to transfer to the subsequent stage.

The drive circuit 542-2 in the memory chip 510-2 is electrically connected to the output driver 531 via the drive circuit 542-1 and the drive circuit 532. Thus, the drive circuit 542-2 can output the internal ready/busy signal RBi received from the logic control circuit 13-2 to the RBn terminal 2f via the drive circuit 542-1, the drive circuit 532, and the output driver 531. Note that a constant current source 543-2 is electrically connected between a node on a line L52, between the drive circuit 542-2 and a TSV 9, and the reference potential VSS (e.g. ground potential). The line L52 electrically connects the drive circuit 542-2 and the TSV 9. The constant current source 543-2 discharges the line L52 to render the potential on the line L52 low (L) (the reference potential VSS) when no signal exists on the line L52.

For example, the drive circuit 542-2 has a NOR gate 542a2 and an odd number of stages of inverters 542b2 to 542d2, which are connected in series. The NOR gate 542a2 equivalently functions as an inverter because one of its two inputs that is connected to the TSV 9 is connected to the line L52 that is set at the reference potential VSS by the constant current source 543-2. The NOR gate 542a2 logically inverts the internal ready/busy signal RBi received from the logic control circuit 13-2 to transfer to the inverter 542b2. Each inverter 542b2 to 542d2 logically inverts the transferred internal ready/busy signal RBi to transfer to the subsequent stage.

The drive circuit 532 in the control chip 520 is electrically connected between the drive circuits 542-1, 542-2 of the memory chips 510-1, 510-2 and the output driver 531. Thus, the drive circuit 532 transfers the internal ready/busy signal RBi received from each memory chip 510-1, 510-2 to the output driver 531.

For example, the drive circuit 532 includes an even number of stages of inverters 532a, 532b connected in series. The input terminal of the first stage of the inverter 532a is connected to the drive circuit 542-1 of the memory chip 510-1 via the bump 6. The input terminal of the first stage of the inverter 532a is connected to the drive circuit 542-2 via the bump 6, the drive circuit 542-1, the TSV 7, and the bump 8. Thus, the drive circuit 532 can amplify and transfer the ready/busy signal received from each memory chip 510-1, 510-2 to the output driver 531.

The output driver 531 in the control chip 520 is electrically connected to the RBn terminal 2f via the TSV 5, the bump 4, and the land 3. The output driver 531 is common to the multiple memory chips 510-1, 510-2.

The output driver 531 is electrically connected between the drive circuits 542-1, 542-2 of the memory chips 510-1, 510-2 and the RBn terminal 2f via the drive circuit 532. Thus, the output driver 531 outputs the ready/busy signal RBn according to the internal ready/busy signal RBi of the memory chip 510-1, 510-2 to the RBn terminal 2f. That is, the output driver 531 receives the internal ready/busy signal RBi and outputs the ready/busy signal RBn according to the internal ready/busy signal RBi. The internal ready/busy signal RBi is an active high signal and takes on a high (H) level when busy and the L level when ready. The ready/busy signal RBn is an active low signal and takes on the L level when busy and the H level when ready. The suffix "n" is the first letter of "negative" indicating being an active low signal.

For example, the output driver 531 has an NMOS transistor 531a. The NMOS transistor 531a has its source connected to ground potential, its drain connected to the RBn terminal 2f via the TSV 5, the bump 4, and the land 3, and its gate connected to the drive circuit 532.

As described above, in the fifth embodiment, in the storage device 500, the output driver 531 common to the multiple memory chips 510-1, 510-2 is placed in the control chip 520. Thus, the number of elements to be mounted in each memory chip 510-1, 510-2 can be reduced, so that the chip area of each memory chip 510-1, 510-2 can be reduced. As a result, the package of the storage device 500 (see FIG. 1) can be easily made smaller, so that the cost of the storage device 500 can be reduced. Further, as compared with the case where the output driver of each memory chip 910 is connected to the external terminal 2 (an output terminal) (see FIG. 12), the number of output drivers connected to the external terminal 2 (an output terminal) can be decreased. As a result, the capacitance in view from the external terminal 2 can be made smaller, so that the consumption current due to charging/discharging that capacitance when a signal is outputted can be reduced.

Sixth Embodiment

Next, a storage device 600 according to the sixth embodiment will be described. A description will be made below focusing on parts in which it is different from the fifth embodiment.

In the fifth embodiment, each memory chip 510-1, 510-2 is configured to put together a signal transferred from the memory chip adjacent above and a signal transferred from the logic control circuit so as to transfer to the memory chip adjacent below. Thus, if the number of memory chips stacked with TSVs increases, the number of stages of logic gates to go through in the transfer of the ready/busy signal to an external terminal increases, so that the output to the external terminal may be delayed.

Accordingly, in the sixth embodiment, a constant current source is placed in the control chip 620 so as to render the internal ready/busy signal RBi high (H), and an output driver 641 to pull the signal line low (L) when the internal ready/busy signal RBi is high indicating being busy, is provided in each stacked memory chip. Thus, the number of stages of logic gates to go through in the signal transfer is reduced, so that the ready/busy signal can be transmitted to the external terminal at high speed.

Figure 9:
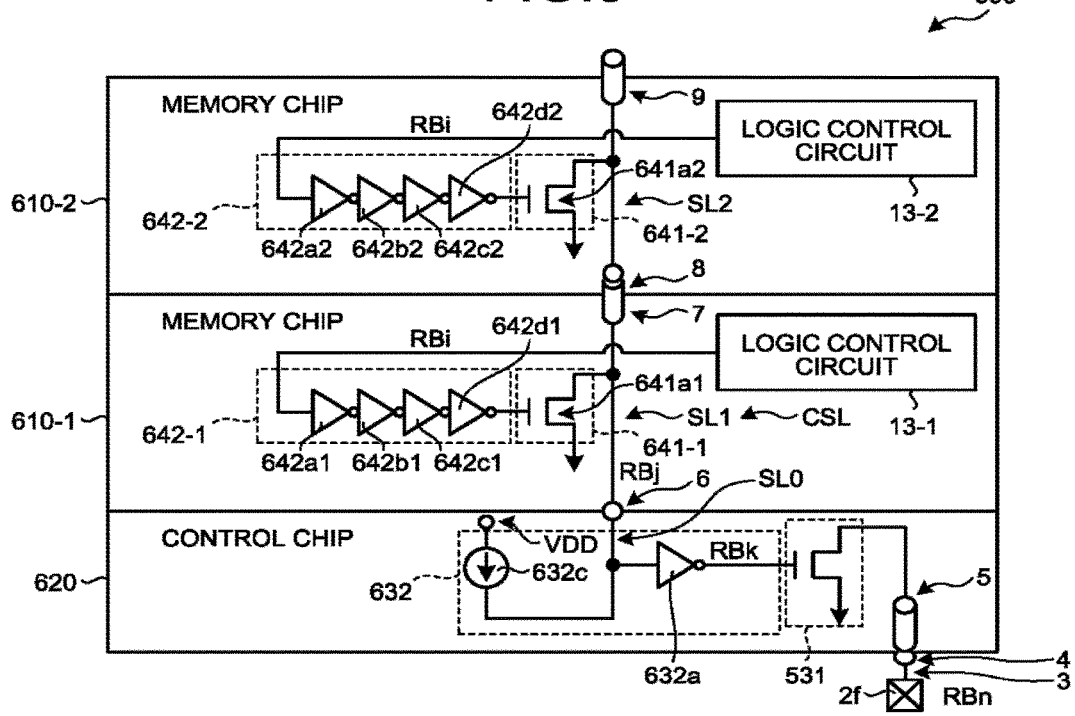
FIG. 9 is a circuit diagram showing the output terminal related configuration of a storage device according to a sixth embodiment.

Specifically, in the storage device 600, the control chip 620 has a drive circuit 632 instead of the drive circuit 532 (see FIG. 8) as shown in FIG. 9. FIG. 9 is a circuit diagram showing the configuration of the storage device 600. The memory chip 610-1 has a drive circuit 642-1 instead of the drive circuit 542-1 (see FIG. 8) and further has an output driver 641-1. The memory chip 610-2 has a drive circuit 642-2 instead of the drive circuit 542-2 (see FIG. 8) and further has an output driver 641-2. Respective signal lines SL1, SL2 of the memory chips 610-1, 610-2 are connected to form a common signal line CSL. The signal line SL1 is connected to the signal line SL2 via a TSV 7 and a bump 8. Note that a line between the bump 6 and an inverter 632a may be called a signal line SL0 and that the signal lines SL0, SL1, SL2 may be collectively called the common signal line CSL. The signal line SL0 is connected to the signal line SL1 via a bump 6.

The drive circuit 642-1 in the memory chip 610-1 is electrically connected between the logic control circuit 13-1 and the output driver 641-1. Thus, the drive circuit 642-1 can transfer the internal ready/busy signal RBi received from the logic control circuit 13-1 to the output driver 641-1.

For example, the drive circuit 642-1 does not have a NOR gate 542a1 (see FIG. 8) but has an even number of stages of inverters 642a1 to 642d1 connected in series. That is, the drive circuit 642-1 is configured not to receive a signal from another memory chip (memory chip 610-2) but to receive the internal ready/busy signal RBi from the logic control circuit 13-1 to transfer to the output driver 641-1.

The output driver 641-1 outputs the internal ready/busy signal RBj according to the internal ready/busy signal RBi onto the common signal line CSL. For example, the output driver 641-1 outputs the internal ready/busy signal RBj of the L level onto the common signal line CSL when the internal ready/busy signal RBi is at the H level (busy). The output driver 641-1 outputs the internal ready/busy signal RBj of the H level onto the common signal line CSL when the internal ready/busy signal RBi is at the L level (ready). The internal ready/busy signal RBj is an active low signal and is at the L level when busy and at the H level when ready.

For example, the output driver 641-1 has an NMOS transistor 641a1. The NMOS transistor 641a1 has its source connected to ground potential, its drain connected to the common signal line CSL, and its gate connected to the drive circuit 642-1.

The drive circuit 642-2 in the memory chip 610-2 is electrically connected between the logic control circuit 13-2 and the output driver 641-2. Thus, the drive circuit 642-2 can transfer the internal ready/busy signal RBi received from the logic control circuit 13-2 to the output driver 641-2.

For example, the drive circuit 642-2 does not have a NOR gate 542a2 (see FIG. 8) but has an even number of stages of inverters 642a2 to 642d2 connected in series. That is, the drive circuit 642-2 is configured not to receive a signal from another memory chip but to receive the internal ready/busy signal RBi from the logic control circuit 13-2 to transfer to the output driver 641-2.

The output driver 641-2 outputs the internal ready/busy signal RBj according to the internal ready/busy signal RBi onto the common signal line CSL. For example, the output driver 641-2 outputs the internal ready/busy signal RBj of the L level onto the common signal line CSL when the internal ready/busy signal RBi is at the H level. The output driver 641-2 outputs the internal ready/busy signal RBj of the H level onto the common signal line CSL when the internal ready/busy signal RBi is at the L level. The internal ready/busy signal RBj is an active low signal and is at the L level when busy and at the H level when ready.

For example, the output driver 641-2 has an NMOS transistor 641*a*2. The NMOS transistor 641*a*2 has its source connected to ground potential, its drain connected to the common signal line CSL, and its gate connected to the drive circuit 642-2.

The drive circuit 632 in the control chip 620 has an odd number of a stage of an inverter 632*a* instead of an even number of stages of the inverters 532*a*, 532*b* (see FIG. 8) and further has a constant current source 632*c*. The constant current source 632*c* is electrically connected between a power supply potential VDD and the common signal line CSL. When either of the output drivers 641-1, 641-2 of the memory chips 610-1, 610-2 is on, the output driver being on, pulls the potential on the common signal line CSL low. And when both the output drivers 641-1, 641-2 of the memory chips 610-1, 610-2 become off, the constant current source 632*c* charges the common signal line CSL to render the potential on the common signal line CSL high. Thus, when a transition occurs from the state where either output driver 641-1, 641-2 is on to the state where all the output drivers 641-1, 641-2 are off, the potential on the common signal line CSL can be rapidly pulled up from "L" to "H". That is, the internal ready/busy signal RBj can be transmitted to an odd number of a stage of the inverter 632*a* via the common signal line CSL at high speed. An odd number of a stage of the inverter 632*a* generates an internal ready/busy signal RBk obtained by logically inverting the internal ready/busy signal RBj to transfer to the output driver 531. Hence, the output driver 531 outputs the ready/busy signal RBn according to the internal ready/busy signal RBk to the RBn terminal 2*f*.

As described above, in the sixth embodiment, in the storage device 600, each memory chip 610-1, 610-2 is configured such that a signal from the memory chip is outputted onto the common signal line CSL via the output driver 641-1, 641-2. Thus, because the signal from each memory chip can be transferred to the control chip 620 side via the common signal line CSL, the number of stages of logic gates to go through in the signal transfer can be reduced as compared with the fifth embodiment, so that the signal can be transmitted from each memory chip to the external terminal (output terminal) 2 at high speed.

Further, in the sixth embodiment, in the storage device 600, the drive circuit 632 of the control chip 620 includes the constant current source 632*c* electrically connected between the power supply potential VDD and the common signal line CSL. When the state where at least one of the output drivers 641-1, 641-2 of the memory chips 610-1, 610-2 is on is switched to the state where both are off, the constant current source 632*c* charges the common signal line CSL to render the potential on the common signal line CSL high. Thus, when a transition occurs from the state where either output driver 641-1, 641-2 is on to the state where all the output drivers 641-1, 641-2 are off, the potential on the common signal line CSL can be rapidly pulled up from "L" to "H". Therefore, signal transmission via the common signal line CSL can be performed at high speed.

Seventh Embodiment

Next, a storage device 700 according to the seventh embodiment will be described. A description will be made below focusing on parts in which it is different from the sixth embodiment.

In the sixth embodiment, the internal ready/busy signal RBj transmitted over the common signal line CSL is an active low signal and is at the L level when busy and at the H level when ready (on standby). For example, if a leak path to the chip substrate exists at a node on the common signal line CSL because of a failure in the production process, a leak current may flow also when the chip is on standby.

Accordingly, in the seventh embodiment, a constant current source is placed in the control chip 720 so as to render the nodes on the common signal line CSL low when on standby, and a PMOS transistor to render the common signal line CSL high when busy, is connected to each stacked memory chip. Thus, even if there is a leak path from a node on the common signal line CSL to the chip substrate, the leak current when on standby can be suppressed, so that the consumption current can be further reduced.

Figure 10:
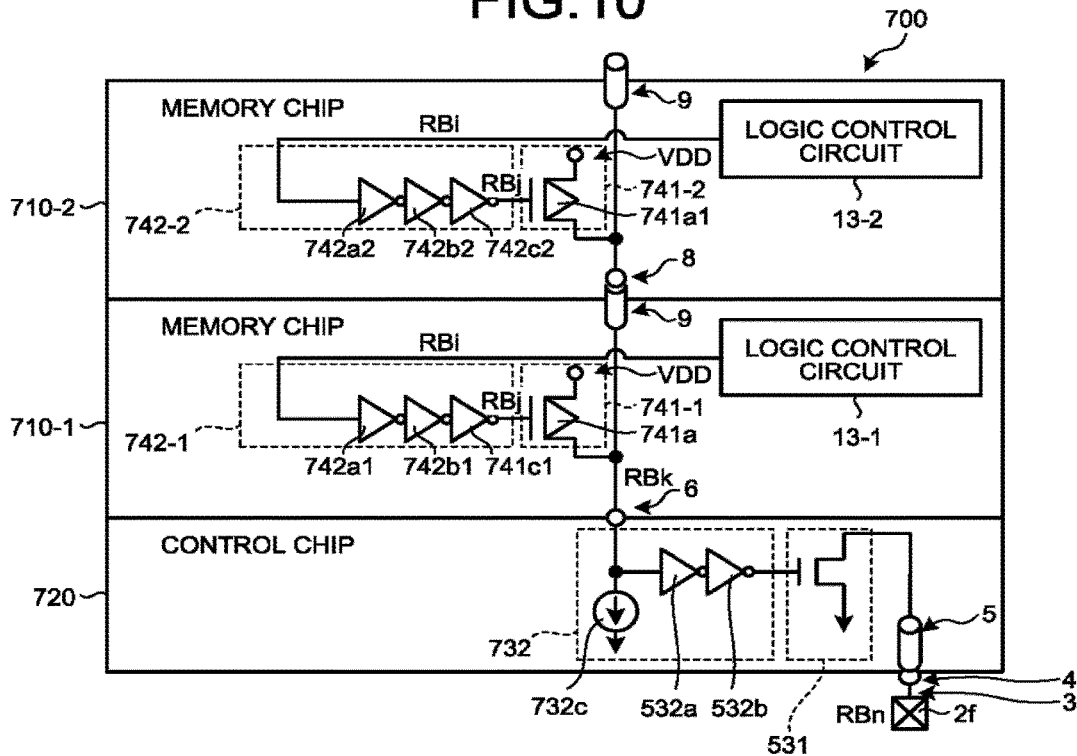
FIG. 10 is a circuit diagram showing the output terminal related configuration of a storage device according to a seventh embodiment.

Specifically, in the storage device 700, the control chip 720 has a drive circuit 732 instead of the drive circuit 632 (see FIG. 9) as shown in FIG. 10. FIG. 10 is a circuit diagram showing the configuration of the storage device 700. The memory chip 710-1 has a drive circuit 742-1 and an output driver 741-1 instead of the drive circuit 642-1 and the output driver 641-1 (see FIG. 9). The memory chip 710-2 has a drive circuit 742-2 and an output driver 741-2 instead of the drive circuit 642-2 and the output driver 641-2 (see FIG. 9).

The drive circuit 742-1 in the memory chip 710-1 is electrically connected between the logic control circuit 13-1 and the output driver 741-1. Thus, the drive circuit 742-1 can generate the internal ready/busy signal RBj according to the internal ready/busy signal RBi received from the logic control circuit 13-1 to transfer to the output driver 741-1.

For example, the drive circuit 742-1 has an odd number of stages of inverters 742*a*1 to 742*c*1 connected in series instead of an even number of stages of inverters 642*a*1 to 642*d*1 (see FIG. 9). That is, the drive circuit 742-1 is configured not to receive a signal from another memory chip (memory chip 710-2) but to receive the internal ready/busy signal RBi from the logic control circuit 13-1. The drive circuit 742-1 logically inverts the internal ready/busy signal RBi to transfer the internal ready/busy signal RBj to the output driver 741-1.

The output driver 741-1 outputs the internal ready/busy signal RBk according to the internal ready/busy signal RBj onto the common signal line CSL. For example, the output driver 741-1 outputs the internal ready/busy signal RBk of the H level onto the common signal line CSL when the internal ready/busy signal RBj is at the L level (busy). The output driver 741-1 outputs the internal ready/busy signal RBk of the L level onto the common signal line CSL when the internal ready/busy signal RBj is at the H level (ready). The internal ready/busy signal RBk is an active high signal and is at the H level when busy and at the L level when ready.

For example, the output driver 741-1 has a PMOS transistor 741*a*1. The PMOS transistor 741*a*1 has its source connected to the power supply potential VDD, its drain connected to the common signal line CSL, and its gate connected to the drive circuit 742-1.

The drive circuit 742-2 in the memory chip 710-2 is electrically connected between the logic control circuit 13-2 and the output driver 741-2. Thus, the drive circuit 742-2 can generate the internal ready/busy signal RBj according to the internal ready/busy signal RBi received from the logic control circuit 13-2 to transfer to the output driver 741-2.

For example, the drive circuit 742-2 has an odd number of stages of inverters 742*a*2 to 742*c*2 connected in series instead of an even number of stages of inverters 642a2 to 642d2 (see FIG. 9). That is, the drive circuit 742-2 is configured not to receive a signal from another memory chip but to receive the internal ready/busy signal RBi from the logic control circuit 13-2. The drive circuit 742-2 logically inverts the internal ready/busy signal RBi to transfer the internal ready/busy signal RBj to the output driver 741-2.

The output driver 741-2 outputs the internal ready/busy signal RBk according to the internal ready/busy signal RBj onto the common signal line CSL. For example, the output driver 741-2 outputs the internal ready/busy signal RBk of the H level onto the common signal line CSL when the internal ready/busy signal RBj is at the L level (busy). The output driver 741-2 outputs the internal ready/busy signal RBk of the L level onto the common signal line CSL when the internal ready/busy signal RBj is at the H level (ready). The internal ready/busy signal RBk is an active high signal and is at the H level when busy and at the L level when ready.

For example, the output driver 741-2 has a PMOS transistor 741a2. The PMOS transistor 741a2 has its source connected to the power supply potential VDD, its drain connected to the common signal line CSL, and its gate connected to the drive circuit 742-2.

The drive circuit 732 in the control chip 720 has a constant current source 732c instead of the constant current source 632c (see FIG. 9). The constant current source 732c is electrically connected between the reference potential (e.g., ground potential) and the common signal line CSL. When either of the output drivers 741-1, 741-2 of the memory chips 710-1, 710-2 is on, the output driver being on, pulls the potential on the common signal line CSL high. And when both the output drivers 741-1, 741-2 of the memory chips 710-1, 710-2 become off, the constant current source 732c discharges the common signal line CSL to render the potential on the common signal line CSL low. Thus, when a transition occurs from the state where either output driver 741-1, 741-2 is on to the state where all the output drivers 741-1, 741-2 are off, the potential on the common signal line CSL can be rapidly pulled down from "H" to "L". That is, the internal ready/busy signal RBk can be transmitted to an even number of stages of inverters 532a, 532b via the common signal line CSL at high speed. An even number of stages of the inverters 532a, 532b transfer the internal ready/busy signal RBk to the output driver 531. Hence, the output driver 531 outputs the ready/busy signal RBn according to the internal ready/busy signal RBk to the RBn terminal 2f.

As described above, in the seventh embodiment, in the storage device 700, each memory chip 710-1, 710-2 is configured such that a signal from the memory chip is outputted onto the common signal line CSL via the output driver 741-1, 741-2. Thus, because the signal from each memory chip can be transferred to the control chip 720 side via the common signal line CSL, the number of stages of logic gates to go through in the signal transfer can be reduced as compared with the fifth embodiment, so that the signal can be transmitted from each memory chip to the external terminal (output terminal) 2 at high speed.

Further, in the seventh embodiment, in the storage device 700, the drive circuit 732 of the control chip 720 includes the constant current source 732c electrically connected between the reference potential (e.g., ground potential) and the common signal line CSL. When the state where at least one of the output drivers 741-1, 741-2 of the memory chips 710-1, 710-2 is on is switched to the state where both are off, the constant current source 732c discharges the common signal line CSL to render the potential on the common signal line CSL low. Thus, when a transition occurs from the state where either output driver 741-1, 741-2 is on to the state where all the output drivers 741-1, 741-2 are off, the potential on the common signal line CSL can be rapidly pulled down from "H" to "L". Therefore, signal transmission via the common signal line CSL can be performed at high speed.

In the seventh embodiment, in the storage device 700, the internal ready/busy signal RBk transmitted over the common signal line CSL is an active high signal and is at the H level when busy and at the L level when ready (on standby). Thus, if there is a leak path from a node on the common signal line CSL to the chip substrate, a leak current when the chip is on standby can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A storage device comprising:
a control chip; and
a plurality of memory chips;
wherein the control chip includes an input buffer common to the control chip and the plurality of memory chips and electrically connected to an external terminal,
a first transmission path going through the input buffer and a second transmission path not going through the input buffer are provided between the external terminal and the plurality of memory chips, and
in a first mode, the control chip enables the input buffer to activate the first transmission path and, in a second mode, disables the input buffer to activate the second transmission path,
the control chip includes a first control circuit that, in the first mode, enables the input buffer and that, in the second mode, disables the input buffer,
the control chip further includes a first transfer switch provided on the second transmission path and electrically connected to the external terminal,
in the first mode, the first control circuit maintains the first transfer switch in an off state and, in the second mode, turns on the first transfer switch, and
each of the plurality of memory chips includes:
a second transfer switch provided on the second transmission path and electrically connected to the external terminal; and
a second control circuit that, in the first mode, maintains the second transfer switch in the off state and, in the second mode, turns on the second transfer switch.

2. A storage device comprising:
a control chip; and
a plurality of memory chips;
wherein the control chip includes an input buffer common to the control chip and the plurality of memory chips and electrically connected to an external terminal,
a first transmission path going through the input buffer and a second transmission path not going through the input buffer are provided between the external terminal and the plurality of memory chips, and in a first mode, the control chip enables the input buffer to activate the first transmission path and, in a second mode, disables the input buffer to activate the second transmission path, the control chip includes a first control circuit that, in the first mode, enables the input buffer and that, in the second mode, disables the input buffer, the control chip further includes a first transfer switch provided on the second transmission path and electrically connected to the external terminal, in the first mode, the first control circuit maintains the first transfer switch in an off state and, in the second mode, turns on the first transfer switch, and each of the plurality of memory chips includes:

a second transfer switch provided on the second transmission path;

a connection switch provided on the second transmission path and that electrically connects the external terminal to the second transfer switch; and a second control circuit that, in the first mode, maintains at least the connection switch in the off state and, in the second mode, turns on the connection switch and the second transfer switch.

3. A storage device comprising:

a control chip; and a plurality of memory chips;

wherein the control chip includes an input buffer common to the control chip and the plurality of memory chips and electrically connected to an external terminal, a first transmission path going through the input buffer and a second transmission path not going through the input buffer are provided between the external terminal and the plurality of memory chips, and in a first mode, the control chip enables the input buffer to activate the first transmission path and, in a second mode, disables the input buffer to activate the second transmission path, the control chip includes a first control circuit that, in the first mode, enables the input buffer and that, in the second mode, disables the input buffer, the control chip further includes a first transfer switch provided on the second transmission path, in the first mode, the first control circuit maintains the first transfer switch in an off state and, in the second mode, turns on the first transfer switch, and each of the plurality of memory chips includes:

a second transfer switch provided on the second transmission path;

a connection switch provided on the second transmission path and that electrically connects the external terminal to each of the first transfer switch and the second transfer switch; and a second control circuit that, in the first mode, maintains at least the connection switch in the off state and, in the second mode, turns on each of the connection switch and the second transfer switch.

4. The storage device according to claim 1, wherein the first mode includes an operation mode in which a control signal is supplied from the external terminal to a control circuit in each of the control chip and the plurality of memory chips using the first transmission path, and the second mode includes a test mode in which the operation of each of the control chip and the plurality of memory chips is checked using the second transmission path.

5. The storage device according to claim 2, wherein the first mode includes an operation mode in which a control signal is supplied from the external terminal to a control circuit in each of the control chip and the plurality of memory chips using the first transmission path, and the second mode includes a test mode in which the operation of each of the control chip and the plurality of memory chips is checked using the second transmission path.

6. The storage device according to claim 3, wherein the first mode includes an operation mode in which a control signal is supplied from the external terminal to a control circuit in each of the control chip and the plurality of memory chips using the first transmission path, and the second mode includes a test mode in which the operation of each of the control chip and the plurality of memory chips is checked using the second transmission path.

* * * * *